United States Patent [19]
Edwards

[11] Patent Number: 5,689,433
[45] Date of Patent: Nov. 18, 1997

[54] METHOD AND APPARATUS FOR COMPACTING INTEGRATED CIRCUITS WITH WIRE LENGTH MINIMIZATION

[75] Inventor: Lawrence B. Edwards, San Jose, Calif.

[73] Assignee: VLSI Technology, Inc., San Jose, Calif.

[21] Appl. No.: 433,438

[22] PCT Filed: Nov. 17, 1993

[86] PCT No.: PCT/US93/11166

§ 371 Date: Nov. 28, 1995

§ 102(e) Date: Nov. 28, 1994

[87] PCT Pub. No.: WO94/11840

PCT Pub. Date: May 26, 1994

Related U.S. Application Data

[63] Continuation-in-part of Ser. No. 978,558, Nov. 19, 1992, Pat. No. 5,416,722.

[51] Int. Cl.[6] .................................................. G06F 17/50
[52] U.S. Cl. ........................ 364/490; 364/489; 364/488
[58] Field of Search ................................ 364/488, 489, 364/490, 491

[56] References Cited

U.S. PATENT DOCUMENTS

| | | | |
|---|---|---|---|
| 5,097,422 | 3/1992 | Corbin, II et al. | 364/491 |
| 5,267,177 | 11/1993 | Sato et al. | 364/491 |
| 5,281,558 | 1/1994 | Bamji et al. | 364/491 |
| 5,309,371 | 5/1994 | Shikata et al. | 364/491 |
| 5,315,534 | 5/1994 | Schlachet | 364/490 |
| 5,416,722 | 5/1995 | Edwards | 364/491 |

*Primary Examiner*—Vincent N. Trans
*Attorney, Agent, or Firm*—Flehr Hohbach Test Albritton & Herbert LLP

[57] ABSTRACT

A computer-aided design method and apparatus for compacting semiconductor circuit layouts to meet a specified set of design rules begins by fracturing a specified circuit layout into a set of trapezoids and storing the resulting cells in a database identifying the boundaries of each cell, and the cell adjacent each boundary. The method additionally includes a procedure for minimizing wire lengths in the compacted layout. Nonempty cells are identified as being of specific materials, and empty spaces between cells are represented. For each cell boundary, the database also stores data representing the boundary edge's end points. Neighboring cells on the same and related layers of the circuit layout share edges in the database. When a point on an edge of a cell is moved, the edge of each neighboring cell that shares that point is also moved. To adjust a circuit layout, the cells in the layout are processed in a sorted order. For each cell, width and spacing design rules are applied to first and second edges of the cell, which may result in movement of the cell and/or adjustment of the cell's width. An adjacent cell adjustment process conforms cells shared points with the adjusted cell. Once the compaction procedure is carried out in a positive x-direction, the coordinates are reversed and it is carried out again in a second pass. The compaction method is performed once for x-direction compaction and once for y-direction compaction. The compaction process is computationally efficient because each cell is linked by the database to its adjacent cells, virtually eliminating the need to search through cells not needed for each design rule check, and because movement of one cell's edges automatically adjusts adjacent cells via their shared edges. The wire minimization embodiment of the invention includes determining whether the second edges have been moved in the second pass, and if so applying the width rules to the first edges to minimize the length of wire represented by the width of the cell having the adjusted edges.

15 Claims, 28 Drawing Sheets

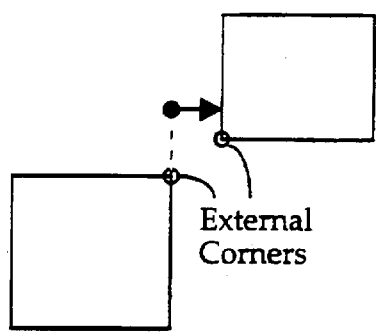
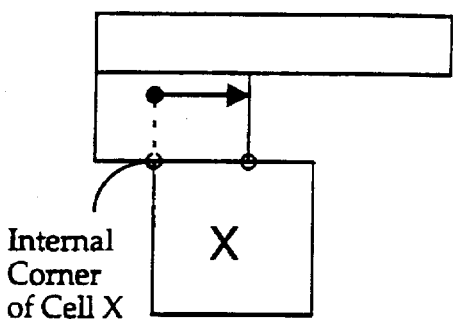
Figure 10A
Figure 10B
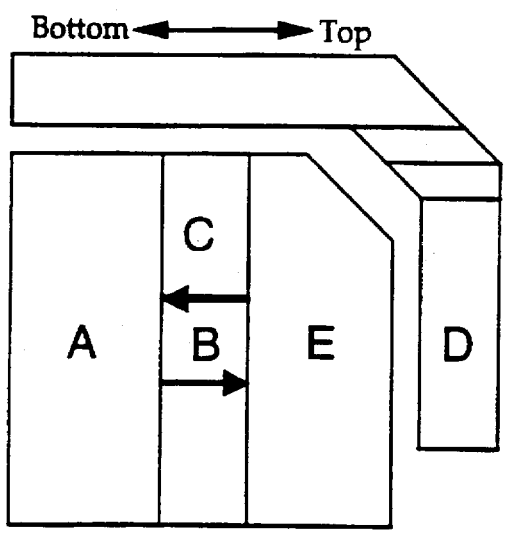
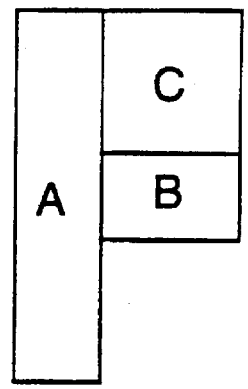
Figure 11A
Figure 11B
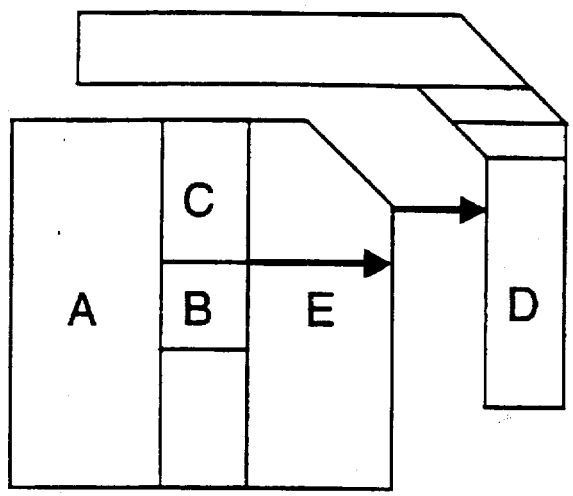
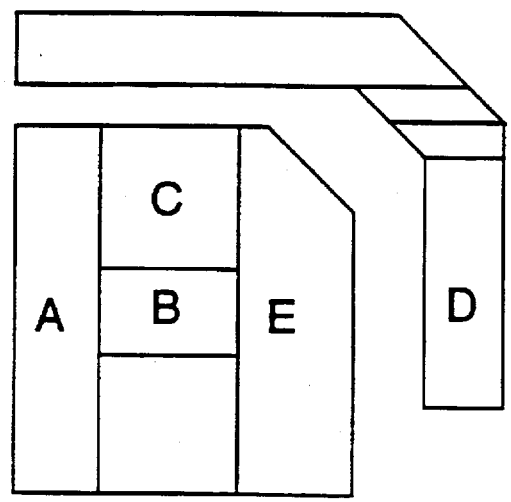
Figure 12A
Figure 12B

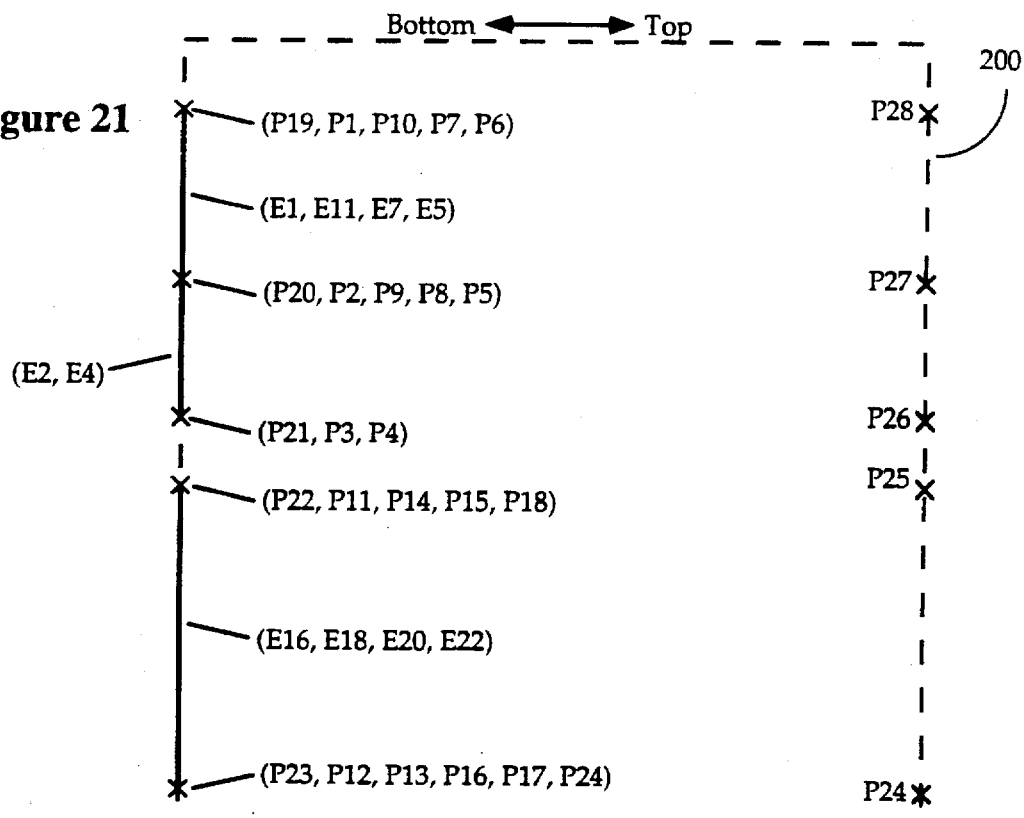
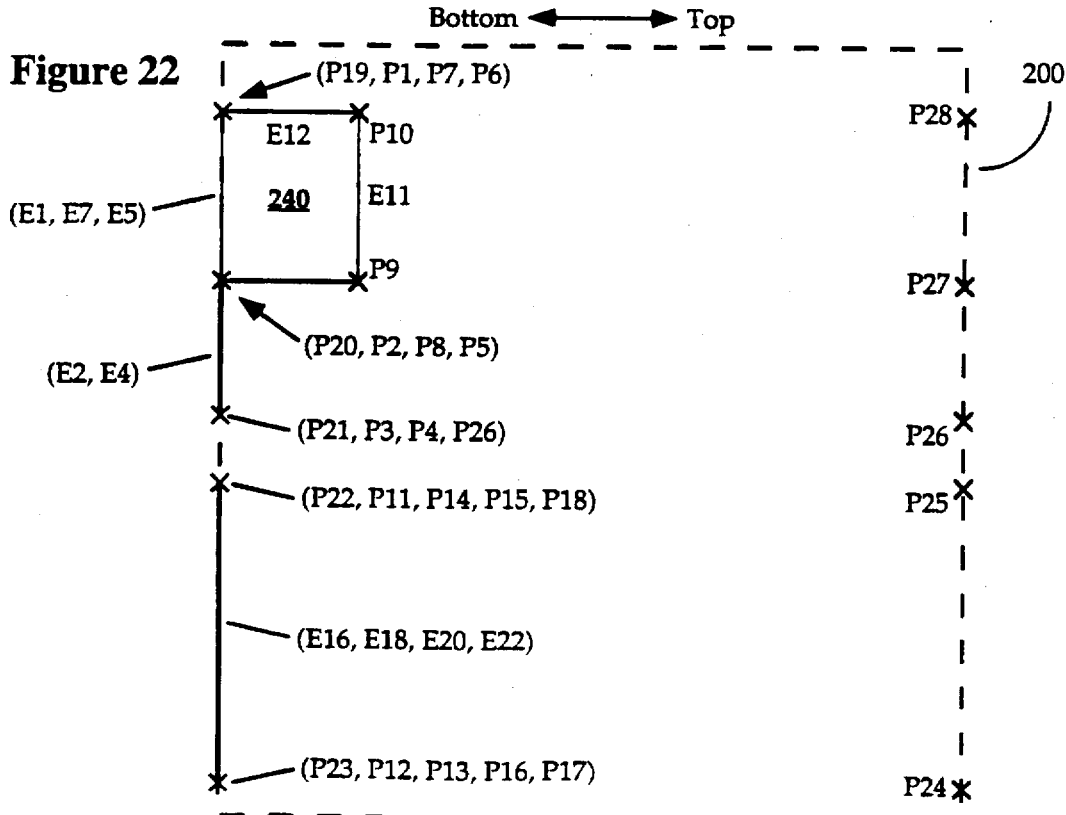

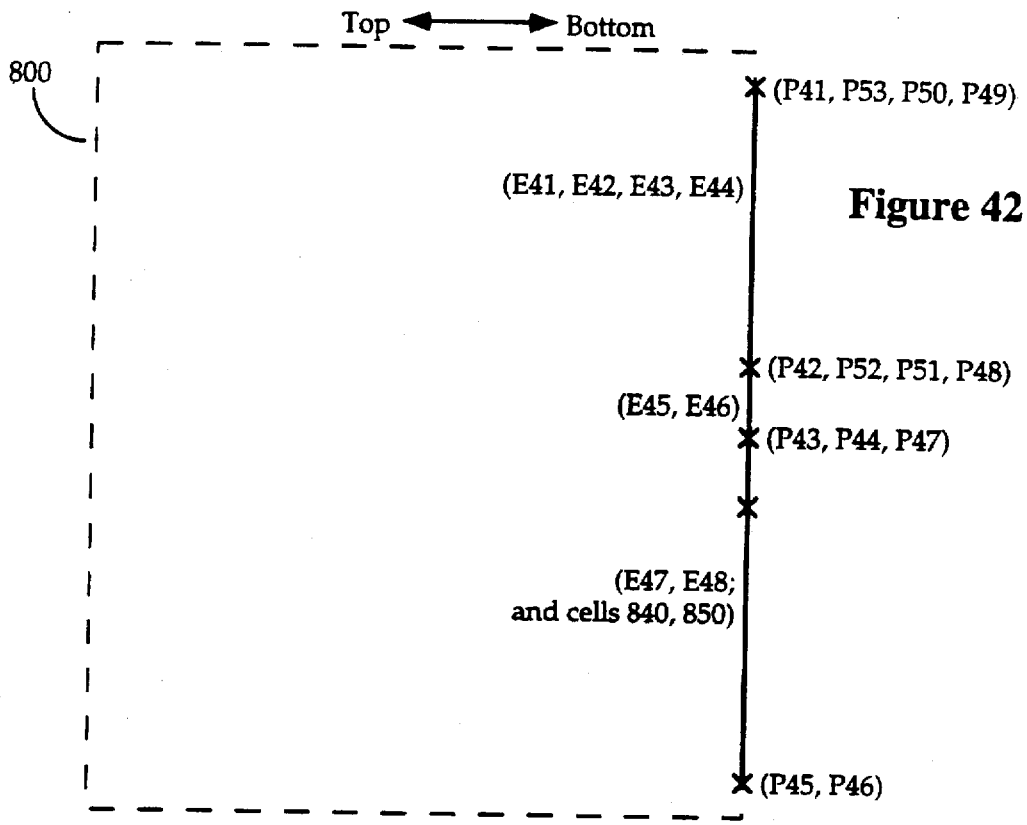
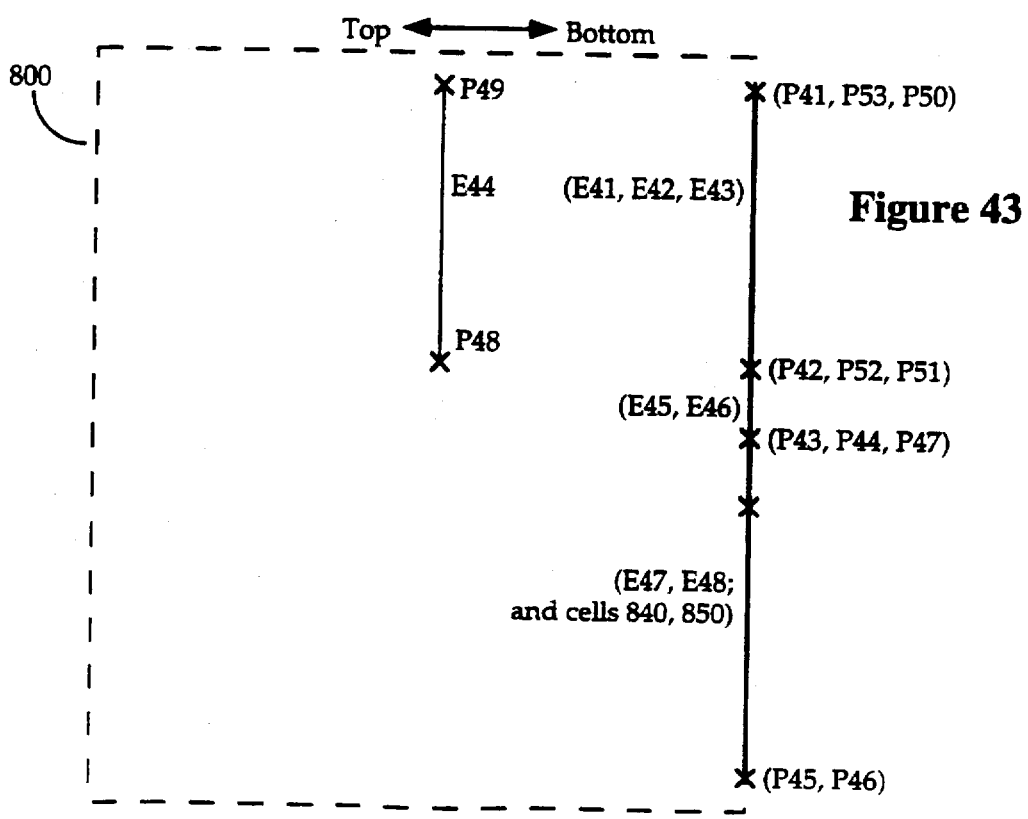

METHOD AND APPARATUS FOR COMPACTING INTEGRATED CIRCUITS WITH WIRE LENGTH MINIMIZATION

This application is a continuation-in-part of U.S. patent application Ser. No. 07/978,558 filed Nov. 19, 1992, now U.S. Pat. No. 5,416,722.

The present invention relates generally to computer aided design systems which facilitate the design of integrated circuits and particularly to computer aided design methods and systems for automatically compacting integrated circuit layouts so as to meet a different set of "design rules" than the design rules originally used for a specified circuit layout.

BACKGROUND OF THE INVENTION

Virtually all complex integrated circuits are designed with the use of computer aided design (CAD) tools. Some CAD tools, called simulators, help the circuit designer verify the operation of a proposed circuit. Another type of CAD tool, called a silicon compiler (also sometimes known as automatic layout or place and route systems), generates the semiconductor mask patterns from a detailed circuit specification. These semiconductor mask patterns for a particular circuit are commonly called the "circuit layout".

Circuit layouts have multiple overlapping mask layers for defining different mask levels (also called layout levels) of a semiconductor integrated circuit. For instance, some layers of the circuit layout will define the regions of the semiconductor substrate that are doped with N-type or P-type dopants, while other layers of the circuit layout will define regions in which materials are deposited on the top of the substrate, such as polysilicon and metal regions, while yet other layers will define apertures to be formed in various layers of material so as to form connections between layers of the semiconductor circuit.

Each layer of a circuit layout is defined as a set of polygons or cells. In some systems, the cells must be rectangles, but most circuit layout systems allow the use of trapezoids and/or polygons whose sides are all vertical, horizontal or at a 45-degree angle to such vertical and horizontal sides.

Typically, a circuit layout will be prepared for a particular set of design rules. For instance, one will often hear that a circuit was manufactured using "2 micron design rules" or "2 micro minimum critical dimensions". Such phrases mean that certain features of the circuit's layout have minimum widths of 2 microns. Later, a faster version of that same circuit may be manufactured using "1 micron design rules" or "1 micron minimum critical dimensions".

While a number of attempts have been made in the past to compress or compact circuit layouts using automated computer techniques, most such prior automatic circuit layout compression systems use graph theory or linear programming methods, and thus lose at least some of the useful information and optimizations in the original layout. In addition, many of the prior art techniques are unable to handle layouts that include polygons with sides at 45 degree angles, and most require so many computer operations as to be impractical commercially.

SUMMARY OF THE INVENTION

A computer-aided design system for compacting semiconductor circuit layouts to meet a specified set of design rules. The specified set of design rules may cause the circuit layout to be compressed or expanded, depending on differences between the design rules used for the original circuit layout and the design rules used during the compacting process.

The automated circuit layout compacting process begins by fracturing a specified circuit layout into a set of convex trapezoids and then storing the resulting trapezoids in a database, herein called the connectivity data structure, that denotes the boundaries of each trapezoidal cell, and the cell adjacent to each such boundary. Empty spaces between cells are also represented in the data structure.

For each cell boundary, the connectivity data structure stores data representing the beginning and end points of each boundary edge (line segment), as well as move data representing the distance by which each such edge has been moved. Neighboring cells on the same and related layers of the circuit layout share edges in the connectivity data structure, and edges share common points. As a result, when a point of a cell is moved, the shared point of each neighboring cell is also moved because it uses the same point entry in the data structure.

Design rules are specified as width rules and spacing rules. Width rules concern the minimum widths of circuit structures and minimum overlaps of circuit structures. For instance, a design rule could require that each polysilicon to diffusion contact be overlapped by polysilicon on all sides by at least x microns. Spacing rules concern minimum spacing between disjoint cells such as the space between two metal lines (metal to metal spacing).

To adjust a circuit layout, a sorted list of the cells in the layout is generated and then the cells are processed in sorted order. When compacting the circuit layout in the x-dimension, the cells are sorted based on the leftmost point of each cell. To process a cell, the specified set of width and spacing design rules are applied to bottom edges of the cell, which may result in movement of the cell and adjustment of the cell's width. Then the specified set of width and spacing design rules are applied to top edges of the cell, which may result in further movement of the cell and adjustment of the cell's width. Next, the edges of adjacent cells that were previously moved (i.e., earlier cells in the sorted list of cells) are adjusted, if necessary, so that all bottom edges of each affected cell have the same move distance, and so that all top edges of each affected cell have the same move distance. If a top edge is moved by the adjacent-cell-adjustment process, then the movement of the top edge is propagated to all cells in the shadow (with smaller values of the dimension in which the layout is being compacted) of the adjusted top edge. Furthermore, for all adjacent cells that are adjusted, the adjacent-cell-adjustment process is performed recursively until all previously processed cells have been adjusted. This process is repeated for all the non-empty cells in the layout.

Then, after flipping the coordinate values for the axis along which compression is being performed (e.g. setting all x-coordinate values to −x), the above compacting process is repeated for all non-empty cells in the layout, skipping the spacing design rules but applying the width design rules a second time to minimize feature widths. Finally, the edges are moved by the previously assigned move distances, and the circuit layout is regenerated.

The compaction process is performed once for x-direction compaction and once for y-direction compaction. The compaction process of the invention is computationally efficient because each cell is linked by the connectivity data structure to its adjacent cells. As a result, the number of cells accessed to perform each design rule check is limited because the cells adjacent the top and bottom edges of the cell to which the design rules are applied can be accessed directly without having to search through and check unrelated cells.

A method is also presented for achieving optimal wire minimization, using the first pass of the compaction method but adopting a different procedure for the second pass, and resulting in shorter wire lengths for layouts with certain constraints. The second pass of the procedure in the wire minimization method includes a step of moving edges of cells to minimize distances from opposite edges of the cells, to minimize the distance between the edges which results in lower overall wire lengths, and propagating these moves to adjacent cells.

BRIEF DESCRIPTION OF THE DRAWINGS

Additional objects and features of the invention will be more readily apparent from the following detailed description and appended claims when taken in conjunction with the drawings, in which:

FIG. 10A shows how spacing design rules are applied to a circuit layout during "overscan" steps, which extend design rule checks to diagonal distances. FIG. 10B shows how width design rules are applied to a circuit layout during overscan steps. As shown the ray tracing process is started at an offset point to find a cell boundary. Then the compaction process will compute the distance between the two cell boundaries and will move the boundary currently being checked, if necessary, to meet the requirements of the design rule.

FIGS. 11A-11B, 12A-12B and 13A-13B represent the circuit layout of FIG. 9A at successive stages of the layout compaction process of the present invention.

FIGS. 19-33 illustrate the compaction of a layout according to the method of the invention.

FIGS. 38-51 illustrate the application of the wire minimization method of the invention to a circuit layout.

DESCRIPTION OF THE PREFERRED EMBODIMENTS

Figure 1:
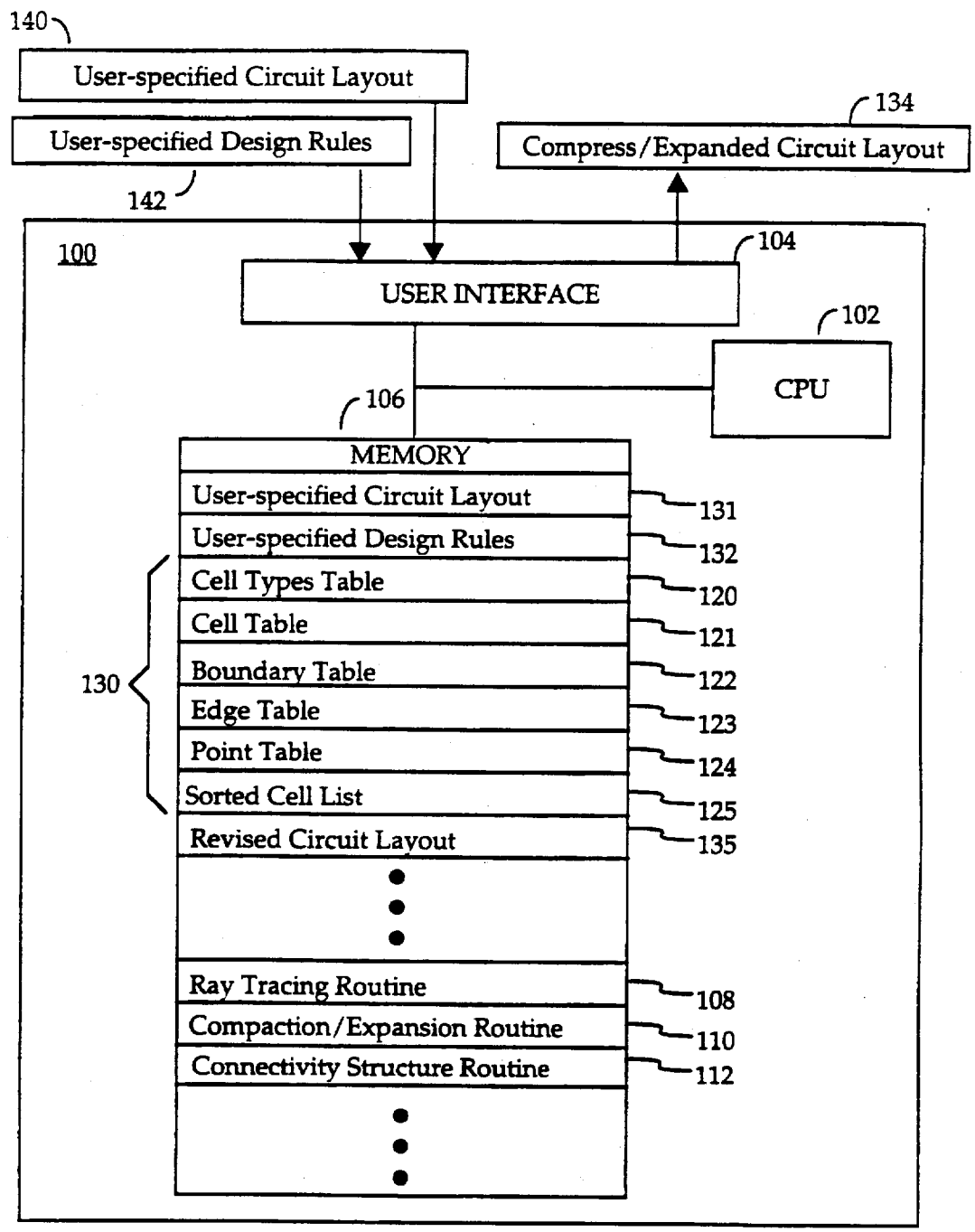
FIG. 1 is a block diagram of a computer aided circuit design system.
Figure 2:
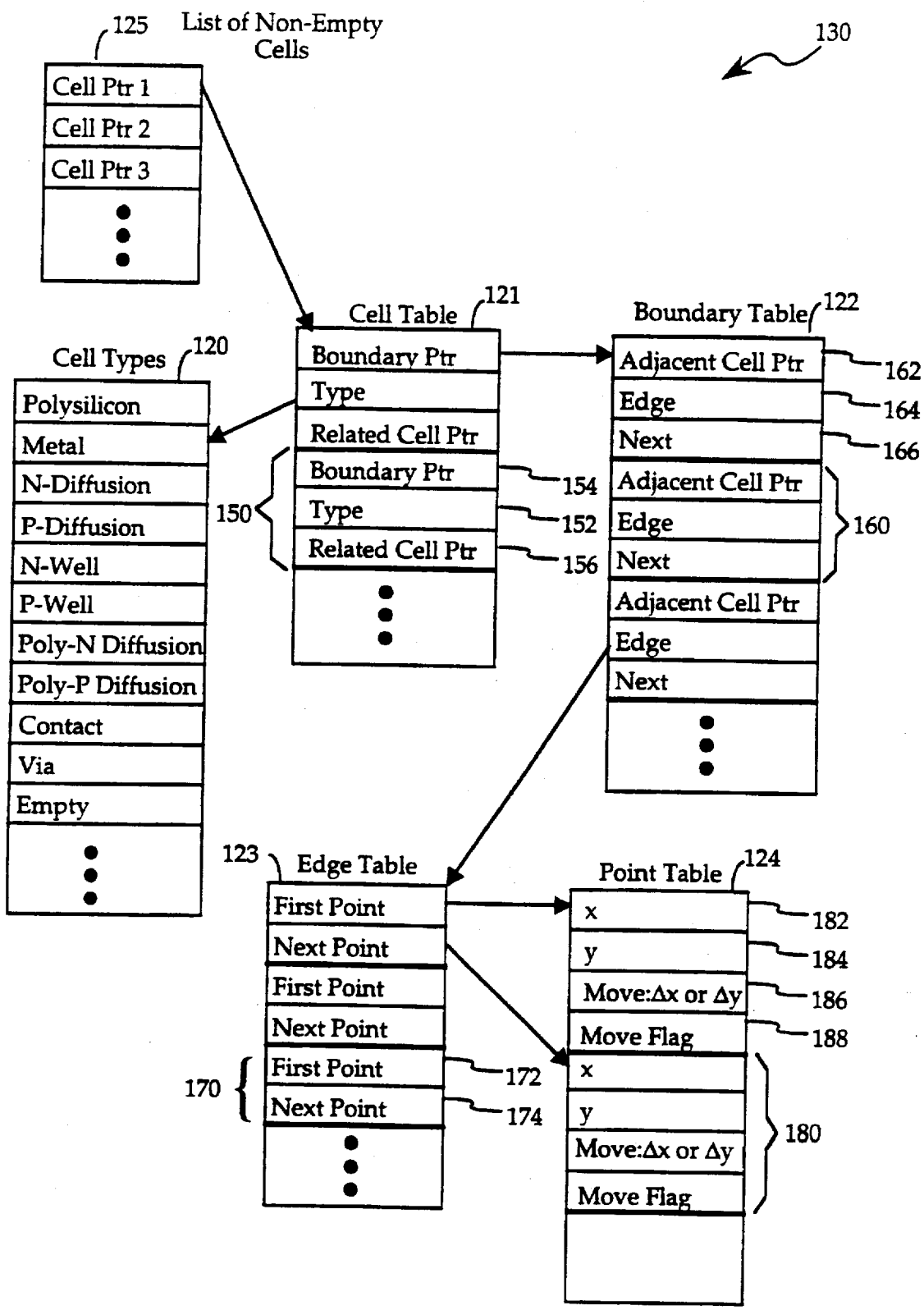
FIG. 2 is a block diagram of the connectivity data structure used to represent a circuit layout in accordance with the present invention.

The present invention is directed to the compaction of a circuit layout as represented in the data structure of FIG. 2, using a system as shown in FIG. 1. The preferred embodiment is implemented on a computer workstation 100 having a central processing unit (CPU) 102. A user-specified circuit layout (or netlist) 140 is input via a user interface 104 to a memory 106, under the control of the CPU 102, and builds up the features of the data structure 130 shown in FIG. 1. The memory 106 may be a disk or any other suitable conventional memory device for storing: arrays of circuit layout data 120–125 (collectively called the connectivity data structure 130 or the circuit layout database); software routines such as routines 108–112; and user-specified circuit layout data 131 (input as a single- or multiple-layer layout 140) and user-specified design rules 132 (input via the user interface 104 as design rules 142). Array 132 is sometimes called the design rule dictionary, and is used in generating a compressed or expanded circuit layout 134. The structure 130 can be used in the compaction procedure of the present invention and for other purposes, including conventional procedures in the design and manufacture of ICs.

The revised circuit layout 134 generated by the computer 100 is initially stored in data array 135 (during layout generation) and is transmitted via the user interface 104 for storage on a tape or disk or is transmitted to a mask generator (not shown).

The software modules stored in memory 106 include a ray tracing routine 108, pseudocode for which appears in Appendix B, and a compaction routine 110, pseudocode for which appears in Appendices C and D.

Connectivity Data Structure

Figure 17:
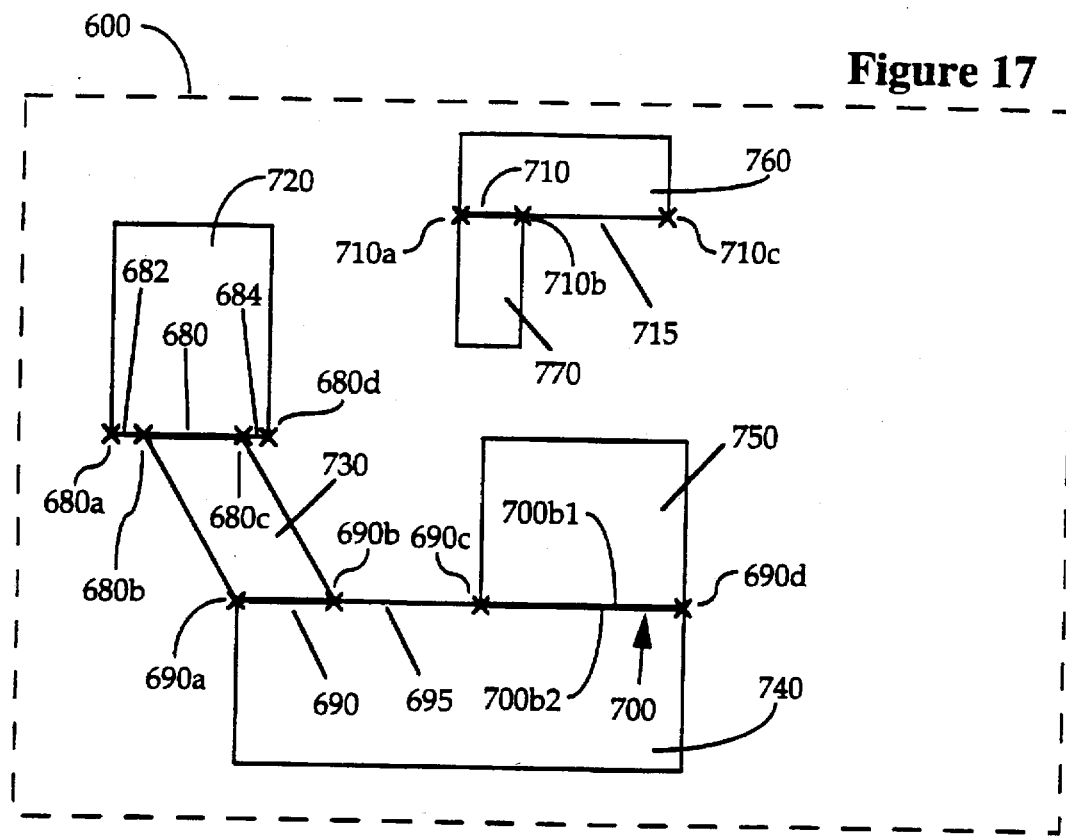
Figure 18:
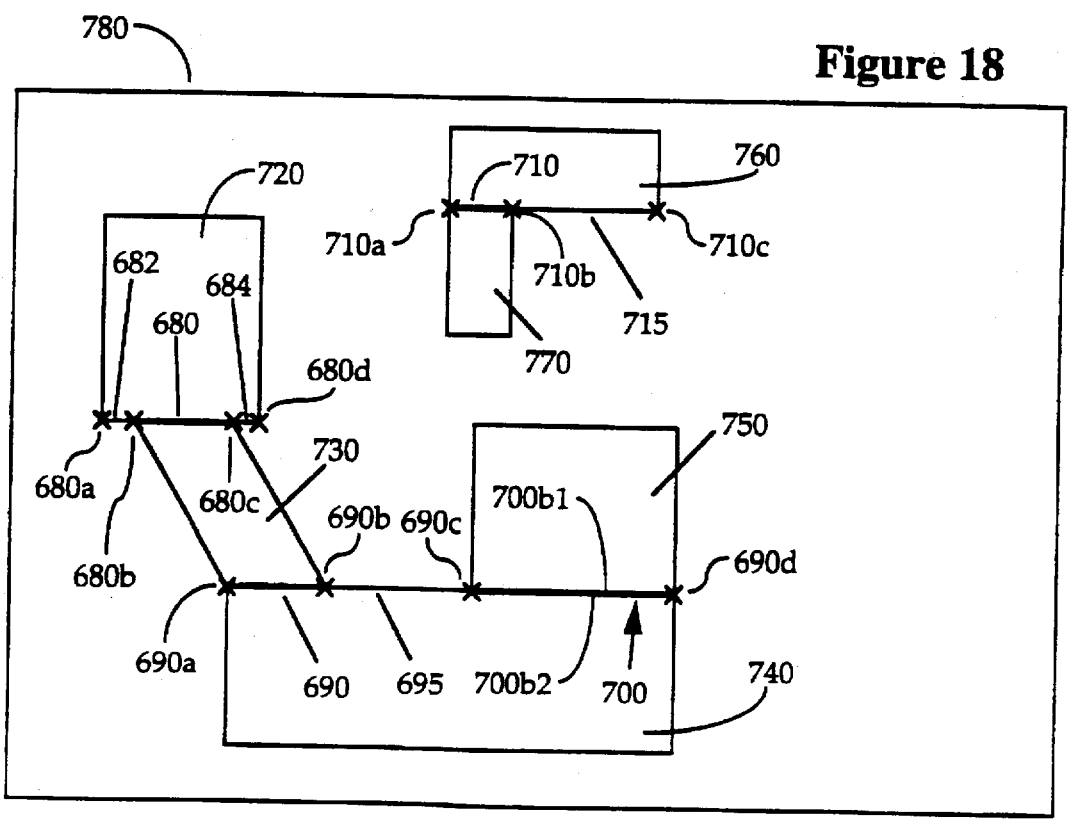

The features discussed in the following description of the connectivity data structure are graphically represented in the drawings. Reference may be made, for instance, to FIG. 17, which shows cells (720, 730, 740, 750, 760), boundaries (700b1, 700b2), edges (680, 682, 684; 690, 695, 700; etc.) and edge endpoints (680a–680d, etc.). FIG. 17 and the other layouts of the figures are described in detail later.

In general, all final structures are convex, and the space of the layout are fractured into connecting tiles or cells, where each cell is specified as being of a particular type of material (metal, polysilicon, etc.) or is empty, i.e. has no specified material.

Cells representing different materials reside on different layers of the layout, and in general are non-interacting. However, multi-layer cells may be represented, and include contact cuts, or "vias", which are contacts between a given material residing on more than one layer. (For an example of this, see the description below of FIG. 17.) They are represented by duplicating the cell as represented on one layer, placing a representation of the cell on the other layer, and generating a pointer to link the two cells.

The edges of a cell are called the "boundaries". Each boundary includes three parts:

(A) a pointer to an "edge" record that describes the (x, y) coordinates of the boundary;

(B) a pointer to the next boundary of the cell; and (C) a pointer to an adjacent cell, if any, that shares the same edge. In FIG. 17, for example, cell 750 has an edge 700 defined by endpoints 690c and 690d, and cell 740 shares this edge 700. Cell 750 has a boundary 700b1, and cell 740 has a boundary 700b2, both of which are coextensive with the edge 700, but are represented differently in the data structure and have different functions In manipulating the layout as expressed in that data structure.

The edge record (see A above) in turn contains two pointers, one to each of two "point" records representing the endpoints of the edge. Each endpoint is represented as an (x, y) coordinate. In this application, references to "points" and "endpoints" are synonymous, meaning specifically the endpoints of an edge as specified by a point record.

Edges of adjacent cells, i.e. edges of different cells that touch one another, contain pointers to the same point record. Similarly, the abutting boundaries of adjacent cells contain pointers to the same edge. Thus, adjacent boundaries point to the same edge, and adjacent edges point to the same endpoints. This sharing of edges and endpoints is important for IC computer-aided design (CAD) programs that perform computations on the coordinates of these edges and points while maintaining connectivity among the represented objects.

Cells that include a semiconductor or other material for the layout are referred to as "solid" cells, and those that do not are referred to as "empty" (or "space-filling") cells. Space-filling cells are useful for IC CAD programs that use data reflecting spatial relationships among solid cells.

In summary, all cells share edges, and all edges have defined endpoints, which leads to efficiencies in compaction of the layout. Access to cells adjacent to a given cell can be had directly, without a search, as would be required using a prior method such as corner stitching. This speeds up the rate at which the layout can be manipulated, such as in a compaction procedure.

FIG. 2 shows the logical relationships among the components of the connectivity data structure 130. The cell types table 120 lists the different cell types used in the cell representation of the specified circuit layout. The cell types include the traditional layout layers, plus certain "combination" layers such as "Poly-N-diffusion" that represent functionally important overlapping circuit features (such as the transistor channel region defined by polysilicon overlapping a diffusion region), as well as an empty cell type, discussed above. The empty cells in the connectivity data structure are not assigned a layout level, because the connectivity data structure provides a pointer to each other cell that is adjacent to a first cell. Thus, the layout levels of empty cells are implied by the cells to which they are adjacent.

As an alternative to storing cell types in a separate cell types table 120, the cell table 121 could directly include a cell type value as one of its fields; in that case, a cell type pointer would not be needed.

The cell table 121 contains one entry 150 for each cell in the specified circuit layout. Each cell entry 150 has a specified type 152 (one of the types listed in cell type table 120) and a boundary pointer 154 to a linked list of boundary items 160 in the boundary table 122. Each cell 150 also has a slot for storing a "related cell pointer", which points to a cell (called a related cell) in a neighboring layer of the circuit. Examples of related cell pointers include:

(1) a related cell pointer in a diffusion cell to a contact layer cell;

(2) a related cell pointer in a first metal layer cell to a via cell; and (3) a related cell pointer in the via cell to a second metal layer cell.

By following a chain of such related cell pointers, the spacing relationships of material regions on different mask levels can be controlled. Typically, the specified design rules will specify a minimum overlap width requirement for related cells.

The boundary table 122 contains a linked list of four or more boundary items 160 for each cell 150. Each boundary item 160 includes an adjacent cell pointer 162 to the cell on the other side of the boundary, an edge pointer 164 that points to an edge entry in the edge table 123, and a next pointer 166 that points to the next boundary item, if any, in the linked list of boundary items for a cell.

The edge table 123 contains data representing the edges referenced in the boundary table 122. Each edge 170 contains two pointers 172 and 174 to "first" and "next" points in the point table 124. The "first" point represents one endpoint of the edge, and the "next" point represents the other endpoint.

Each endpoint 180 in the point table 124 has an x-coordinate value 182 and a y-coordinate value 184, and a move value 186 which represents movement of the point in either the current direction of compaction (i.e., either the x- or y-direction) when the compaction procedure is carried out on the layout. This move value will be discussed in greater detail below.

Each edge 170 is typically referenced by two boundary items, since each edge is shared by two cells. In addition, many points 180 in the point table 124 could be shared by three or four edges, since three or four edges may meet at many of the points in the fractured circuit layout.

The connectivity data structure 130 used by the present invention explicitly represents connectivity between cells by way of both the adjacent cell pointers in the boundary table 122 and the related cell pointers 156 in the cell table 121. The connectivity data structure 130 also explicitly represents empty space with additional cells. Since all cell edges are linked to adjacent cells, connectivity and spacial relationships between neighboring circuit structures can be efficiently accessed or derived without having to search the entire circuit layout.

Cell list 125 is a sorted list of pointers to all the cells in the cell table 121, where the cells are preferably sorted by their lowest x-dimension value (without regard to the cell types of the various cells) during a first pass of the compaction process, and then are resorted by their lowest y-dimension value during a second pass. During such a compaction procedure, the cells in the layout are processed in the order identified in the cell list 125.

Fracturing an Input Circuit Layout

Figure 3:
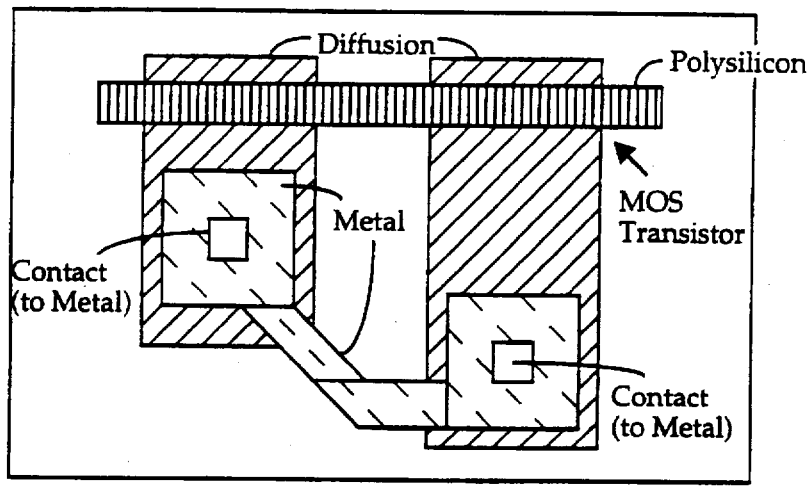
FIG. 3 depicts a small segment of a simple circuit layout.
Figure 4:
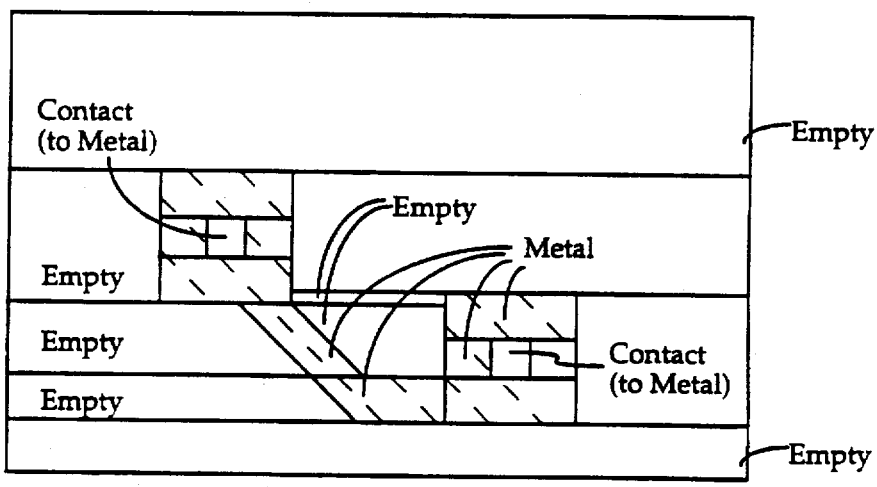
FIGS. 4 and 5 depict portions of the circuit layout of FIG. 3 after the layout has been fractured in the x dimension into trapezoidal strips.
Figure 5:
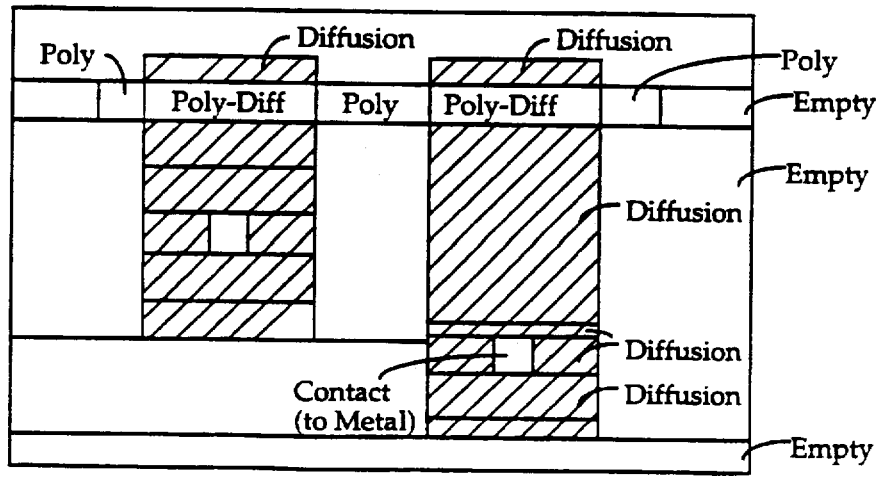

FIGS. 3–5 and 15–18 show how a circuit layout is fractured. Referring to FIGS. 3–5, the layout of FIG. 3 is fractured by dividing the input cell structures into horizontal trapezoidal strips, which are then stored as separate cells (of different types) in the connectivity data structure. When fracturing a circuit layout into trapezoidal strips, additional lines are drawn in only one dimension to form trapezoidal cells. The dimension along which these new lines are drawn is the dimension in which layout compression is to be performed. In FIG. 4, the non-shaded areas outside the metal regions represent empty cells. The non-shaded square areas inside the metal regions represent contacts from the metal regions to the underlying diffusion region. Note that the metal regions completely overlap the contacts despite the lack of shading in the contact regions in the Figures.

FIG. 5 shows an example of the five cells generated to represent a MOS transistor, formed by a polysilicon line crossing a diffusion region. In particular, there are two diffusion cells, one on either side of the polysilicon line, two polysilicon cells representing the portions of the polysilicon line not overlapping the diffusion region, and a "poly-diffusion" cell representing the area in which the polysilicon line overlaps the diffusion region. In this example, polysilicon cells, diffusion cells and poly-diffusion cells represent three types of cells whose spacing relationships are governed by a set of design rules.

Most design rules are applied to a set of three cells, generally representing a cell that may be compressed or expanded and the cells on either side of that cell. For example, a width design rule governing metal/contact region overlaps would be applied to the cell sequence "contact, metal, empty" and would define the minimum width of the metal region between the contact and empty cells.

Figure 15:
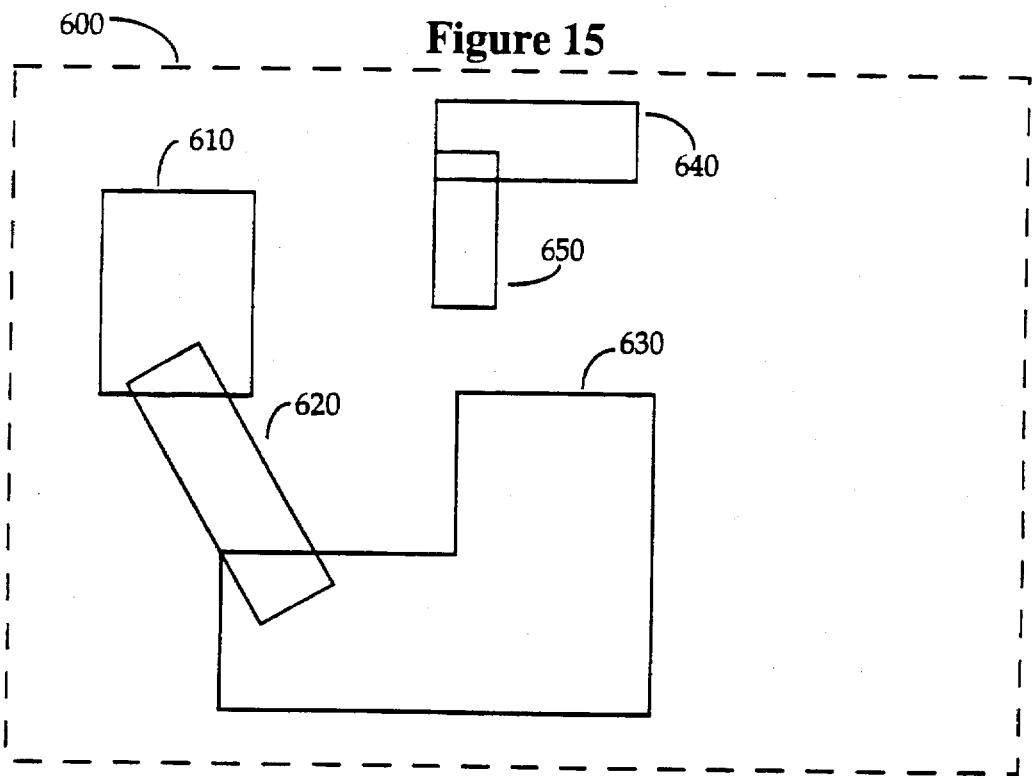
FIGS. 15-18 illustrate the fracturing of objects in a layout according to the invention.
Figure 16:
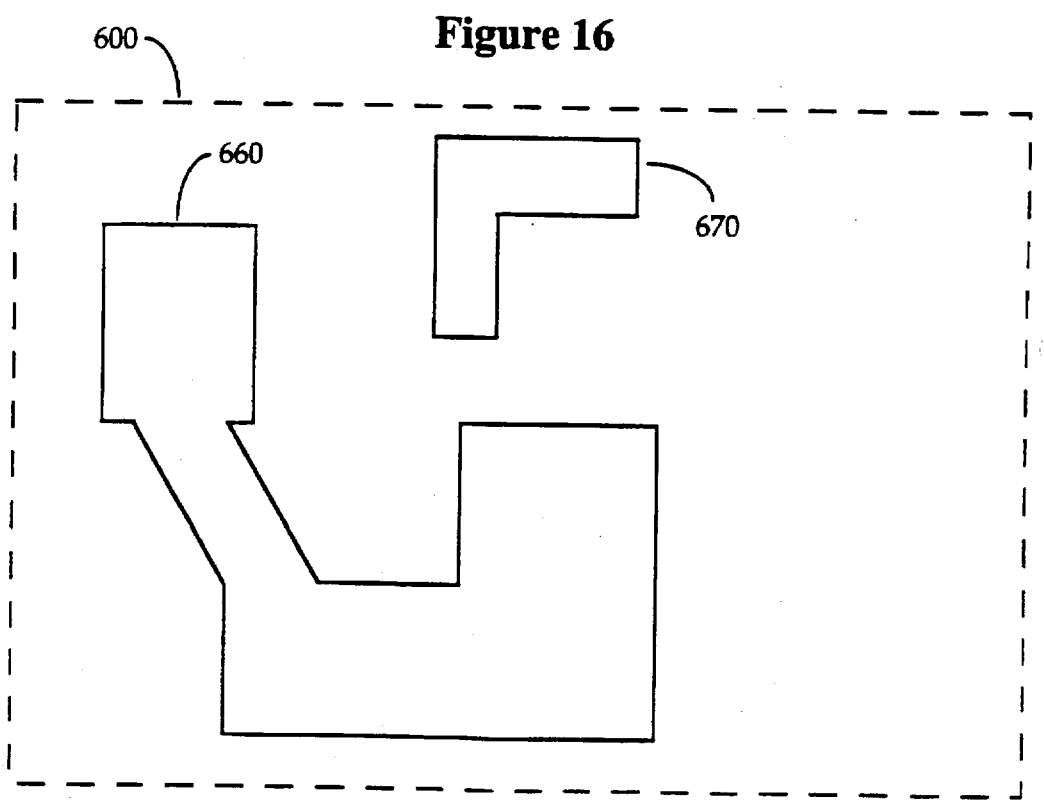

FIGS. 15–18 illustrate the fracturing procedure in somewhat greater detail. In FIG. 15, layout 600 includes five cells or polygons 610–650, with cells 610–630 and cells 640–650 overlapping as shown. The overlapping cells are of the same material, and are therefore converted into just two single cells 660 and 670, respectively, as shown in FIG. 16. The list of cells is accordingly minimized, without losing any of the layout information, and the geometry of the layout is considerably simplified.

The next step is to introduce horizontal edges wherever needed, so as to convert the arbitrary input polygons into a list of convex polygons covering the same space. Because this is done in by horizontal slicing, the polygons in the list are divided into horizontal objects, which is useful for the layout compaction procedure.

FIG. 17 shows the way this is done. Horizontal edges 680, 690, 700 and 710 (shown in bold in FIG. 17) are introduced, these being the minimum number of edges necessary to ensure that all the resulting polygons are convex. At the same time, edges 682 and 684, collinear with edge 680, are generated, these three edges being bounded by points 680a–680b, 680c–680d and 680b–680c, respectively (the points being marked for clarity by x's). Edges 690, 695 and 700 are similarly bounded by points 690a–690d as shown, and edges 710 and 715 are bounded in the same fashion by points 710a–710c.

The generation of the horizontal edges 680–682, 690–700 and 710–715 can be done in any methodical manner, such as by starting at the upper left and working towards the lower right, placing edges wherever a concave angle is located. The resulting cell list now includes six cells 720–770 instead of the initial five (610–650), but they are now much better suited to processing by compacting, wire minimization, or other layout processing applications. In particular, they are now well suited for generating the linked data structure of the invention that is to be used by such applications.

As each structure is generated and stored, it takes the form of the data structures shown in FIG. 2, including the cell pointers 125, the cell table entries 150, the cell entries 160, and so on. For instance, cell 720 in FIG. 17 has a corresponding cell pointer (in cell list 125 of FIG. 2), and includes pointers to each of its boundaries, such as the boundaries along cell 730, which includes the three edges 680, 682 and 684. The boundary pointer in the cell table 121 that corresponds to edge 680 will point to a cell pointer 160 in boundary table 122, and the cell pointer will in turn have an edge pointer 164 pointing to a first point entry in edge table 123, the first point being point 680b in this case. The "next point" entry will correspond to point 680c. Each of the first and next point entries points to an x,y coordinate stored in the point table 124.

It is a straightforward matter to generate all of these entries, and this is done automatically for each structure (including edges, points, etc.) generated. Given the above description, no further teaching is needed to actually generate such data structure entries; in the following discussion, then, though the details of generating such data structures are not always discussed, it should be taken that whenever a graphic structure is described as being generated, the corresponding object entry is in fact generated and stored in the appropriate tables in the data structure of FIG. 2.

In addition, an initial cell 780 (shown in FIG. 18) is generated for each IC layer that is at least as large as the overall dimensions of the entire circuit layout. The adjacent cell pointer of the boundaries of each such all-encompassing cell are set to the null pointer, to indicate that there is no adjacent cell.

Design Rules

Appendix A is a list of typical design rules. Each width design rule lists three cell types. "Compound" cell types represent overlapping structures, such as poly over diffusion, representing a transistor gate. Each spacing design rule lists only two cell types, with an implied "middle cell type" that is always of the type called "empty". Thus, even the spacing design rules always apply to a sequence of three cell types.

During processing of a circuit layout, every specified design rule is compared with the cell currently being processed, and all design rules applicable to that cell are applied. For instance, if the ray trace (discussed below) from one of the top or bottom edges of a cell detects that the adjacent cell is not empty, no spacing design rules will be applied to that edge, but various width design rules might be applicable.

Figure 6:
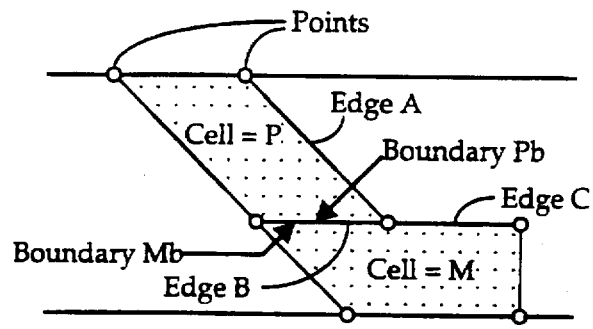
FIG. 6 depicts a small circuit layout and the portions thereof that are represented in the corresponding connectivity data structure.

FIG. 6 shows some of the connectivity data structure elements with respect to a trapezoidal cell and its neighbor.

An essential aspect of the connectivity data structure is that cells share edges, and edges share points. This sharing of edges and points is essential to the compaction methodology of the present invention, because the compaction process assigns move distances to edges and points of each cell that it processes. Thus, the edges of neighboring cells, which share the moved edge or edges, are automatically moved at the same time. When the edges of a cell are assigned move distances, the compaction process checks the current move distances that may have already been assigned by an adjacent cell and then adjusts other edges of the cell, if necessary, so that all top edges of the cell move together rigidly and all bottom edges move together rigidly.

Figure 7:
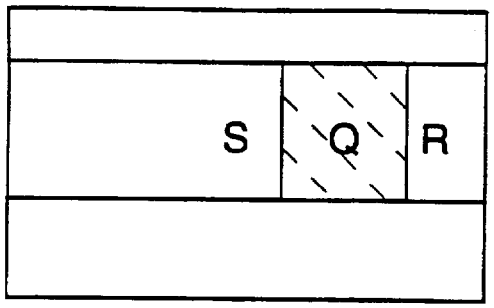
FIG. 7 represents a first circuit layout and FIG. 8 represents the circuit layout of FIG. 7 after one polygon has been added to it.
Figure 8:
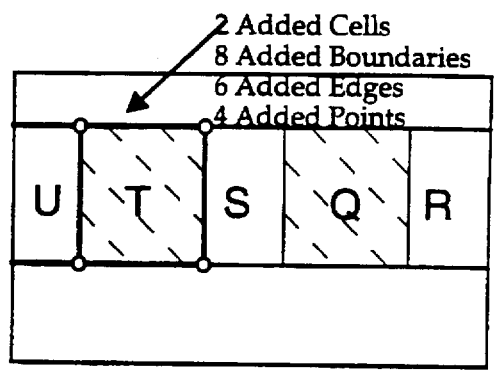

FIGS. 7 and 8 show the memory requirements for adding one rectangular cell to an existing layout. In particular, since each cell, boundary and point requires the storage of three integers (see structures 121, 122 and 124 in FIG. 2), and each edge requires the storage of two integers (see structure 123 in FIG. 2), the amount of added storage is 54 integers.

Figure 9A:
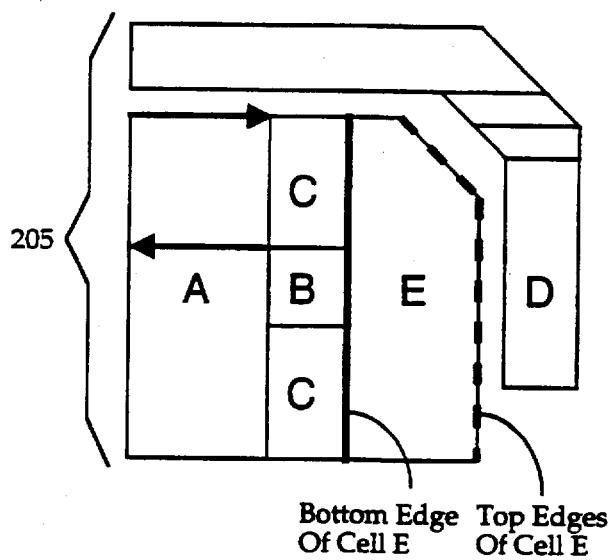
FIG. 9A represents a circuit layout to be compacted by the present invention.

FIG. 9A shows a small portion of a circuit layout, with all cells shown in FIG. 9A comprising metal layer cells, except for cell B which is a metal-to-diffusion contact cell. For compaction in the x direction, the bottom edge of cell E (shown by a wide line) is the edge with the smallest value of x, while the top edges of cell E (shown by a dashed line) are those with the largest values of x.

Ray Tracing Process

Edge-to-edge constraints are determined by the ray tracing procedure of the invention, which is simpler and more efficient than a shadowing procedure. The ray tracing process works by first creating a vector that is in the direction of compaction, begins at a point on the edge of a cell and ends either at the maximum/minimum x- or y-dimension of the layout or at the first object (which will include a boundary indicated by an edge or point) that it encounters. Edge intersections and cell transitions are successively calculated beginning at the cell that contains the beginning point of the ray. If the ray intersects a boundary of a cell, then a cell transition (described below in the compaction procedure) takes place. Then the current cell is changed to be the cell that is adjacent to the intersected boundary, and the process searches for the next ray-to-boundary intersection. The search terminates when a cell is encountered that meets a specified terminating condition.

The terminating condition depends on the type of search. There are two types of searches: a width search and a spacing search. Width searches are terminated when a non-empty cell is encountered that is not the same type as the beginning cell. The width search is used to determine minimum material widths, minimum material overlaps and in some cases minimum edge-to-edge spacing such as in the case of the spacing required between a diffusion contact and an MOS channel (edge-to-edge space between contact and polysilicon-diffusion regions).

Spacing searches, which are used to determine minimum spacing between disjoint cells such as metal to metal, are terminated when a cell of non-empty type is encountered.

Appendix B provides a more detailed description of the ray tracing process, in the form of pseudocode. Appendix C provides detailed pseudocode description of the layout compaction process. The pseudocode used in Appendices B and C is, essentially, a computer language using universal computer language conventions. While the pseudocode employed here has been invented solely for the purposes of this description, it is designed to be easily understandable by any computer programmer skilled in the art. The computer programs in the preferred embodiment are written primarily in the Mainsail computer language, which is a product of Xidak Corporation, Palo Alto, Calif.

Compaction Procedure of Appendix C

The compaction procedure of the invention is described below in connection with the pseudocode of Appendices C and D. Appendix C relates to a first embodiment, and variations on that embodiment are introduced in Appendix D to resolve anomalies that can occur under certain circumstances with Appendix C, in order to minimize wire lengths in the final layout.

Figure 14A:
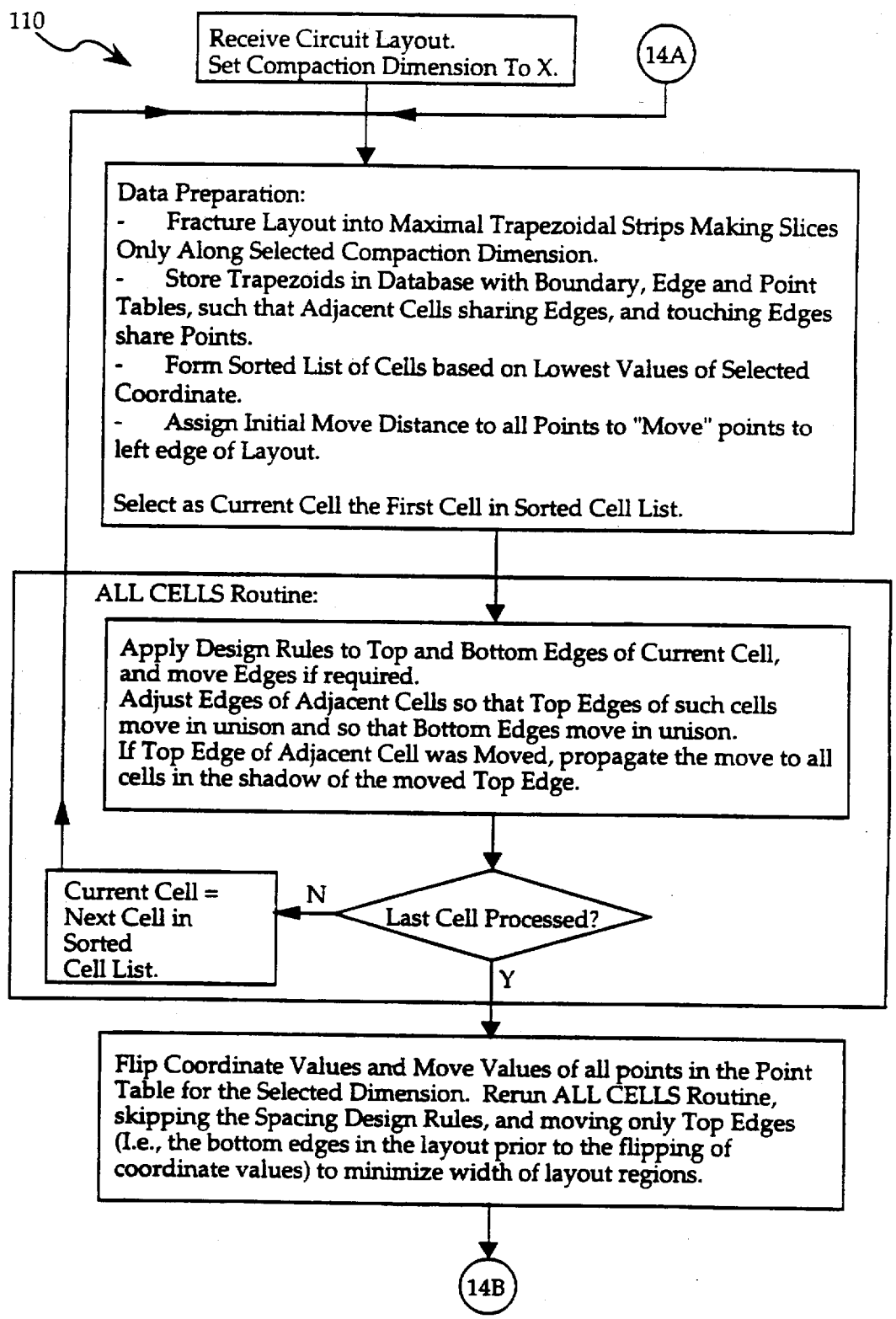
FIGS. 14A and 14B are flow charts of the circuit layout compaction process of the preferred embodiment.
Figure 14B:
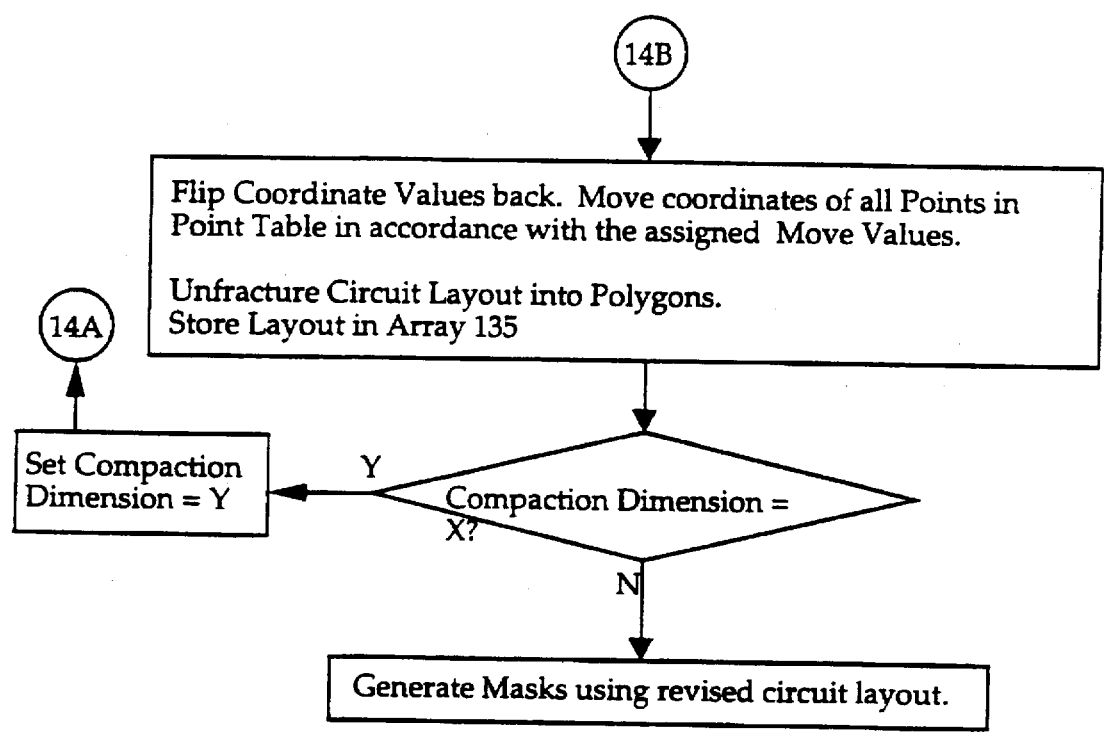

The following explanation is made with reference to FIGS. 14A and 14B, and to the pseudocode representation of the compaction process which appears in Appendix C. The automated circuit layout compaction process begins by fracturing a specified circuit layout into a set of trapezoids (step 1 in Appendix C), as described above with respect to FIGS. 3–5 and 15–18. In step 2, the resulting trapezoids are stored in a connectivity data structure (such as cell table 121 in FIG. 2) that denotes the boundaries of each trapezoid cell, the cell type (i.e. the material), and the cell adjacent to each such boundary.

Empty spaces between cells are represented by empty cells, i.e. cells whose type is designated as "empty". For each cell boundary, the connectivity data structure stores data representing the beginning and end points of each boundary edge (line segment), as well as move data representing the distance by which each such edge has been moved in the compaction procedure (as described below). Neighboring cells on the same and related layers of the circuit layout share edges in the connectivity data structure, and edges share common points. As a result, when an edge or point of a cell is moved, the shared edge or point of each neighboring cell is also moved, because it uses the same point coordinates data. (In the description of the invention herein, when an edge is described as being moved, this means that its points have been moved.)

Next, the cells in the layout are combined into a linked list and sorted (step 3), based on the leftmost point of each cell when compacting the layout in the x dimension, and a list of pointers to the sorted cells is stored in the cell list 125. To make sure that the layout is compacted as much as possible, in step 4 all points in the point table are initially assigned a move distance that would move the point to the left edge (lowest coordinate value in the selected dimension) of the layout. This effectively collapses all the points in the entire layout, as a preliminary matter, to the left edge of the layout, such as layout 205 shown in FIG. 9.

The compaction process is performed on one cell at a time, starting with the first cell in the list and then processing each succeeding cell in the list.

Before processing a cell, the move distances assigned to the cell's top and bottom edges are inspected and adjusted, if necessary, so that all top edges of a given cell have the same move distance as the other top edges of that cell, and so that all bottom edges of the cell have the same move distance as the other bottom edges. More particularly, the maximum move distance for all the top edges of a given cell is assigned to the other top edges of that cell, and the maximum move distance for all the bottom edges of that cell is assigned to the other bottom edges (step 5.1).

To process a cell, the specified set of width and spacing design rules which are applicable to this cell (as determined by the cell's type) are applied to bottom edges of the cell, which may result in movement of the cell and adjustment of the cell's width (steps 5.2 and 5.3). Then the specified set of width and spacing design rules are applied to top edges of the cell (steps 5.4 and 5.5), which may result in further adjustment of the cell's width and movement of the cell.

FIG. 10A shows a situation in which a spacing design rule can be violated by two cell corners being too close, while FIG. 10B shows a situation in which a width design rule can be violated by boundaries of neighboring cells that are too close to each other. To catch such design rule violations and to move cells or edges so as to meet the requirements of the design rules, steps 5.2, 5.3, 5.4, and 5.5 are each repeated as "overscan steps" (see steps 5.2(b), 5.3(b), 5.4(b) and 5.5(b)) using a ray starting at an offset (or overscan) point when the edges being tested have an endpoint at an outer corner for spacing design rule tests, or an internal corner for width design rule tests.

Next (step 5.6), the edges of adjacent cells that were previously moved (i.e., earlier cells in the sorted list of cells) are adjusted, if necessary, so that all bottom edges of each affected cell have the same move distance, and so that all top edges of each affected cell have the same move distance. If a top edge is moved by the adjacent-cell-adjustment process, then the movement of the top edge is propagated to all cells in the shadow (with smaller values of the selected dimension) of the adjusted top edge (step 5.7). Furthermore, for all adjacent cells that were adjusted, the adjacent-cell-adjustment process is performed recursively until all previously processed cells have been adjusted (step 5.8). This process is repeated for all the non-empty cells in the layout.

Then (step 6), the coordinate values for the axis along which compression is being performed are flipped (e.g. setting all x-coordinate values to −x), and the above compacting process is repeated for all non-empty cells in the layout, skipping the spacing design rules but applying the width design rules a second time to minimize feature widths. Step 6 is sometimes called "wire length minimization". Finally, all the edges in the circuit layout are moved by the previously assigned move distances (step 7).

The compaction process must be performed once for x-direction compaction and once for y-direction compaction (steps 8 and 9). Then a new, revised circuit layout is generated from the data in the circuit layout database by converting the cells into the largest possible polygons, so as to produce a circuit layout with the minimum number of polygons. The revised layout is stored in array 135 (see FIG. 1). Finally, a set of masks is generated using the revised circuit layout (step 10 of Appendix C).

Figure 9B:
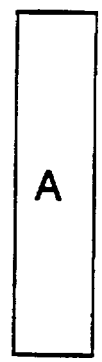
FIG. 9B represents a revised version of one polygon in the circuit layout of FIG. 9A.

FIG. 9A represents an initial specified layout having cells labelled A, B, C, D and E. All cells shown are metal layer cells, except for metal-to-diffusion contact cell B. The direction of compaction is the horizontal x-axis, and thus the cells are processed in an order based on their leftmost coordinate. As shown by FIG. 9B, when cell A is compared with a minimum width design rule, for example in this example, it is compressed, resulting in a cell with a smaller width than it previously had.

FIG. 11A shows the vectors used for ray tracing with respect to the B cell, for application of minimum width design rule checking. FIG. 11B shows that the width of cell B has been adjusted by the compaction process. Since cell B shares a common edge with cell C, cell C is also adjusted (by step 5.6 if cell C was previously processed).

FIG. 12A shows the scan forward (i.e. towards the "top", which in this figure is to the right) ray trace for cell E for minimum width checking, resulting in the top edge of cell E being moved. Also shown in FIG. 12A is the scan forward ray trace for minimum space checking, with this trace terminating at the bottom edge of cell D. A move distance is assigned to cell D based on this spacing check. The results of the processing of cell E are shown in FIG. 12B, wherein the spacing distance between cells E and D has been slightly reduced, to the minimum allowable under the design rules (depending upon the materials involved).

Figure 13A:
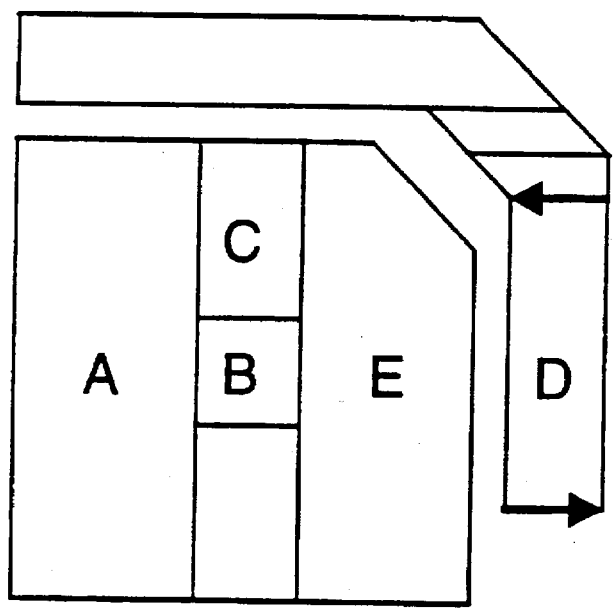
Figure 13B:
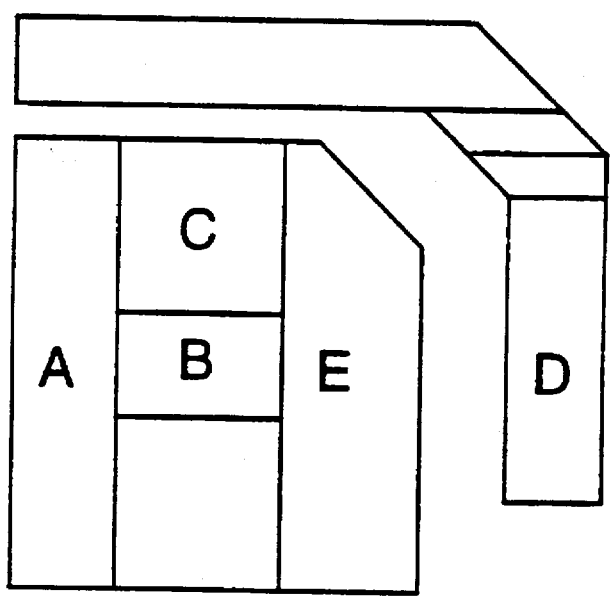

Finally, FIG. 13A shows scan forward and backwards ray traces for minimum width checking cell D, with FIG. 13B showing the result. Note that all points of cell D were assigned a move distance before the processing of cell D, and that any additional move distances generated by the processing of cell D are added to the previously assigned move distances for those points.

FIGS. 19-33 illustrate in detail the application of the method of the invention to a simple layout 200 with an enclosing cell (shown in dotted fashion) the size of the entire layout. Three solid cells 210, 220 and 230 of some selected material are in the netlist in the input layout, and are to be treated by the compaction procedure of Appendix C. In these figures, while the relevant edges and points are illustrated, not all of the edges are labeled (such as those between points P19–P20 and P22–P23, respectively), though they are in fact stored in the database.

Figure 20:
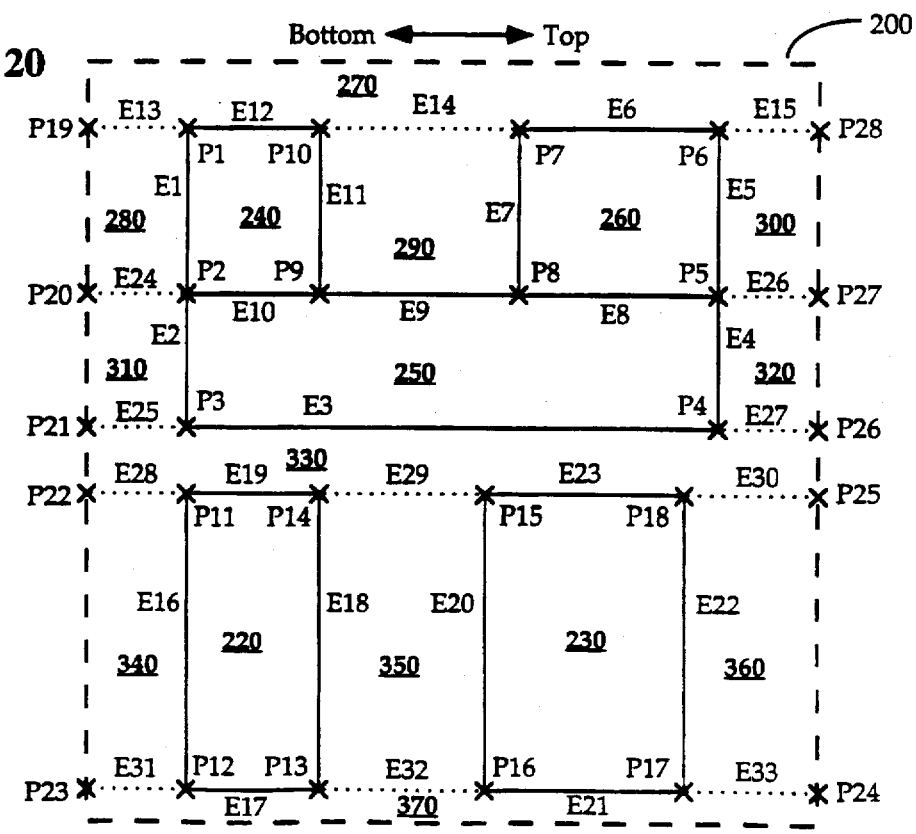
Figure 22A:
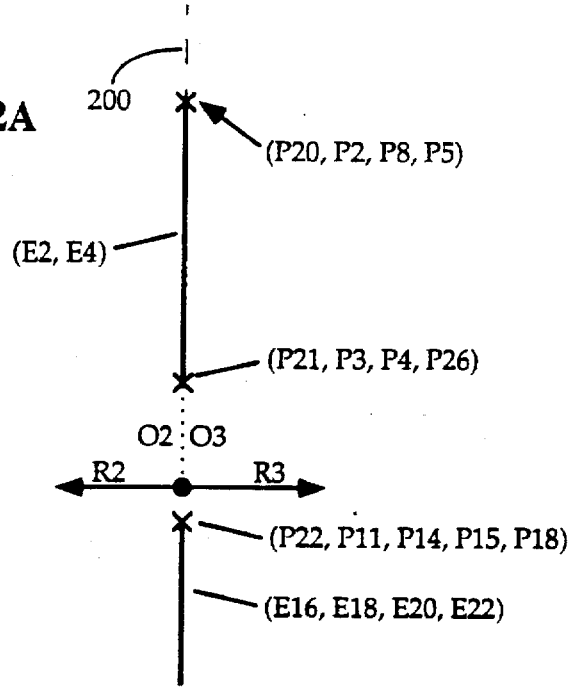

In step 1, the layout 200 is fractured, and in steps 2 and 3 the connectivity database is modified to reflect the resulting structures, which appear in FIG. 20. There are now five solid cells: the original cells 220 and 230, and three cells 240–260, which together correspond to input cell 210. The edges and points relating to each of these solid cells and to the empty cells 270–370 are marked as edges E1–E33 and P1–P28, respectively.

In step 4 of Appendix C, as a preliminary step all of the points in the table that correspond to an edge belonging to a solid cell are assigned a move distance ($\Delta x$) which serves to bring all of the points to the left edge of the layout. The result appears in FIG. 21. Note that the points 24–28 on the right edges of the empty cells 270, 300, 320, 330, 360 and 370 have not been moved. It should be noted that the points being "moved" actually means that their $\Delta x$ (or $\Delta y$) offsets have been altered, so the net result is that the point appears at a different position in the layout; the absolute coordinates of a given point are not changed throughout the procedure of minimization (although when the procedure is finished it is an option to reassign absolute coordinates if desired).

The method now enters the All Cells Routine. As a general matter, the cells are processed in the order found in the sorted cell list, with the preferred sorting order being from the lowest left-edge coordinates to the highest. For cells that have left edges with the same x-coordinate, a secondary sort may be done by the lowest y-coordinate. By this sorting method, the cells in FIG. 20 will be treated in the order: 240, 250, 220, 230, 260. Other sorting methods will serve as well, such as by highest coordinate, as long as the sort is methodical and reproducible, and preferably does not result in cells being treated redundantly by the compaction method, so as to minimize inefficiencies.

At step 5.1(a), the method is therefore first treating cell 240. The move distances for the points P1 and P2 on the bottom edge of this cell are identical, i.e. the move distance necessary to bring them to the left edge of the layout. Thus, step 5.1(a) has no effect on these points. Step 5.1(b) likewise has no effect on points P9, P10 on the top edge of cell 240, which, given the present $\Delta x$'s for its four endpoints, presently has zero width and zero area (which will be corrected in later steps).

It is important to note that the $\Delta x$ assignments to the endpoints do not alter the original, stored coordinates of the points, but only their offsets, in order to minimize the layout. Thus, the information of the absolute coordinates of these points is not lost.

In step 5.2(a), the ray tracing routine of Appendix B is used to determine whether there is another cell less than a minimum specified distance away. This is not the case, since the next object over is the left edge of the layout.

In step 5.2(b), external corner points are considered for corner-to-corner distance criteria. When an offset ray is generated for external point P1 on the bottom edge E1 and searches backwards, it locates only the left edge of the layout 200, and stops, since there is no other solid cell.

Step 5.3 applies width design rules to the current cell 240. Searching backwards has no effect. Searching forward locates the points P9 and P10. This is done by the ray tracing routine as follows. A ray is generated from point P1 that extends forward as far as possible until it hits either a side of the layout or another object (point or edge). In this case, it first hits point P10 (searching from point P1). Appendix B, step 3 thereby locates the boundary of the current cell 240 that intersects this ray.

Note that associated with edge E11 in FIG. 20 are two boundaries: one, the right boundary of the cell 240, and the other, the left boundary of empty cell 290. At first, the ray hits the right boundary of cell 240. In Appendix B, step 3, "Bndry" is set equal to this boundary, P=P10, NextCell=cell 240, and NextType=the type of cell 240 (i.e. the material code). In this case, at step 4 of Appendix B, the NextType equals the BeginCell. Type, so we repeat step 3.

On the second iteration of step 3, the next boundary, i.e. the left boundary of empty cell 290, is encountered; note that the intersected point is still point P10. Now the adjacent cell is cell 290, so the NextType is empty. Step 4 is now false, so we proceed to step 5 and return (P10, left boundary of cell 290) as the result of the ray tracing routine.

Going back now to Appendix C, step 5.3(a) applies the width rules to cell 240 by adjusting the x-offset distance $\Delta x$ for point P10. This brings it out the minimum width distance (taken from Appendix A) away from the left edge E1 of the cell 240, as shown in FIG. 22. The width of cell 240 is the same as the original width (FIGS. 19–29 being to scale relative to one another), since for this example it is assumed that the original width of cell 240 was the minimum width allowable for a cell of this material between two empty cells.

Now step 5.3(a) is repeated for point P2, and results in point P9 being moved the same distance as P10 was moved, as illustrated in FIG. 22.

Step 5.3(b) does nothing in this case, since there is no internal corner point distance to consider.

The TopEdge subroutine (Appendix C, page 3) is now carried out. Step 5.4 accomplishes nothing new, since the width of the current cell 240 has already been adjusted and there are no internal corner point spacing problems.

Step 5.5(a) beings with point P10, and uses the ray tracing routine of Appendix B to generate a ray searching forward from P10 and intersecting the first object, namely point P7. Note that the ray finds point P7 by searching its absolute x-coordinate, ignoring for the moment its x-offset ($\Delta x$); thus, point P7 is correctly determined to be "forward" of point P10, even though its relative position is to the left, given its current x-offset. However, the spacing is determined using the x-offsets, and it is found that the current position of point P7 is less than the allowed distance to the right of point P10 (in fact, P7 is currently to the left of point P10), so the position of P7 is adjusted by modifying its x-offset accordingly, to position it the minimum allowed distance to the right of point P10, as shown in FIG. 23.

Figure 23:
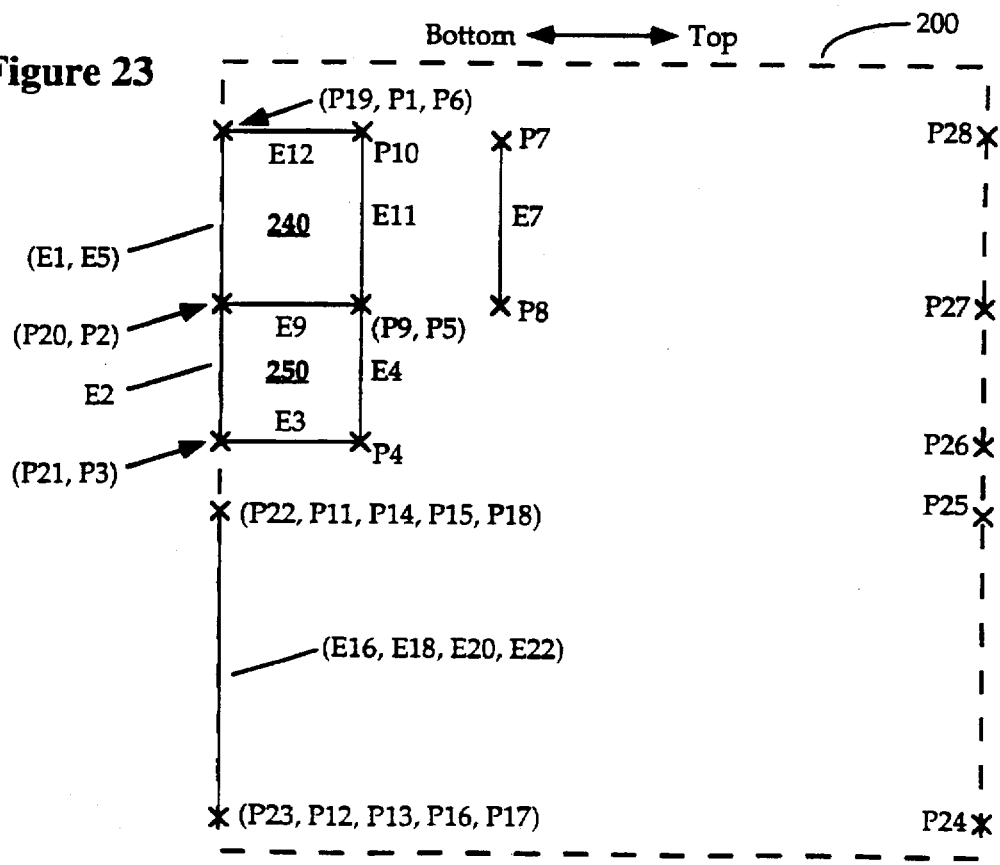

Step 5.5(a) is repeated for point P9, thus adjusting the offset $\Delta x$ for point P8 to move it to the position shown in FIG. 23.

Figure 23A:
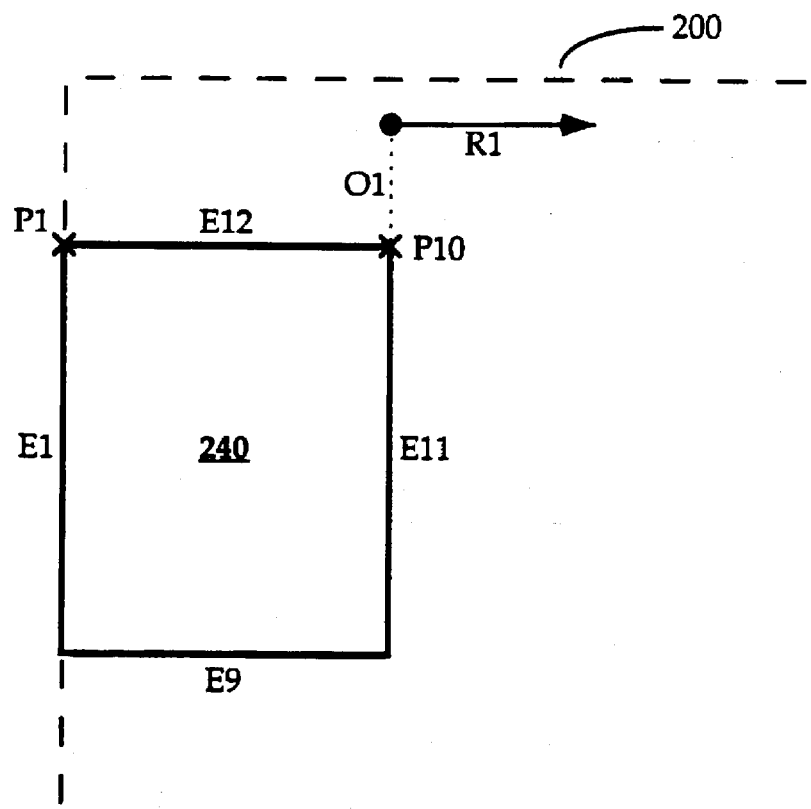

Step 5.5(b) is carried out, but has no effect in this situation. For point P1, a ray (not shown) is generated, pointing to the left; however, there is zero distance to the edge of the layout 200 and the top edge of the layout is the only object above the point P1, so there is no diagonal offset of another object to consider. This is also the case with ray R1 (shown in FIG. 23A), which is generated to inspect diagonal offsets from point P10 and extends to the right edge of the layout 200 (though in FIG. 23A the length has been compressed to fit the ray in the figure). It has a vertical offset O1, which is extended until the ray R1 collides with the top edge of the layout 200. Since this is not another cell, the corner offset inspection is ended here. If it were a cell instead of the edge of the layout, it would also be ended, since the offset would be y-offset instead of a diagonal offset, and y-spacing is dealt with in the second iteration of the method of Appendix C (after execution of step 9).

If there had been a cell above point P10 but offset to the left or right, then the offset O1 and length of ray R1 would have been adjusted so that the tip of the ray R1 touched the point at the external corner of the other object, and then these lengths would have been used to calculate the diagonal distance between the point P10 and the new point; and this would have been compared with the allowable corner-to-corner distance, if adjustments made to the intersected point if necessary. This is not the case here, so step 5.5(b) has no effect and the method moves on to step 5.6.

Since there are no adjacent cells having points that have been moved previously, step 5.6 has no effect, and the same is true for steps 5.7 and 5.8.

The method now returns to step 5.1, with the next cell 250 as the current cell. Steps 5.1 and 5.2 have no effect, since the two bottom points P2 and P3, and the two top points P4 and P5, at this point all aligned with the left edge of the layout 200, have the same move distance.

Step 5.2(a) has no effect, since points P2 and P3 are on the edge of the layout. Step 5.2(b) also has no effect: a ray R2 (see FIG. 22A, which is an enlargement of a portion of FIG. 22) is generated (at this point, with zero length) with an offset O2, which is extended from point P4 until it encounters point P14, at which point the method breaks out of the corner search; as noted at Appendix B, step 7, the corner spacing search must begin in an empty cell. The same happens with ray R3 (which extends to the right edge of the layout 200, though in FIG. 22A the length has been compressed) and offset O3 (extending from point P4), so that no corner spacing search is completed with respect to points P3 and P4. (Note that cell 250 has not yet been expanded out.)

Step 5.3(a) is now applied to cell 250, which is expanded to the minimum allowable width, just as with cell 240; see FIG. 23. Step 5.3(b) has no effect.

Step 5.4(a) also has no effect, since cell 250 has already been expanded to minimum width, and step 5.4 does not apply. Step 5.5(a) does not apply, since there are no other cells to space in the forward direction from cell 250. Step 5.5(b) also does not apply. Steps 5.6 through 5.8 do not have any effect, since there are no such adjacent cells that have been moved as described. The result of processing the layout to this point is illustrated in FIG. 23.

Figure 24:
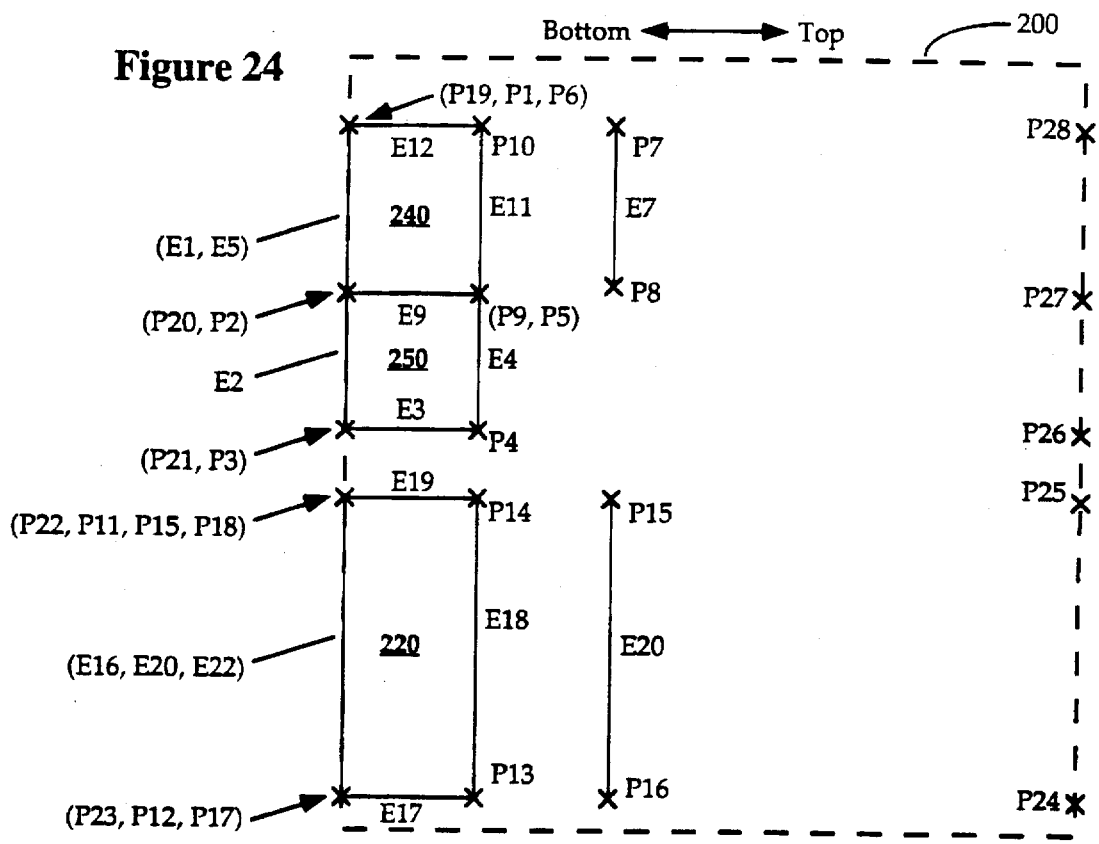

The All Cells routine is repeated for cell 220, resulting in the layout illustrated in FIG. 24. The processing of cell 220 is analogous to that of cell 240.

Figure 25:
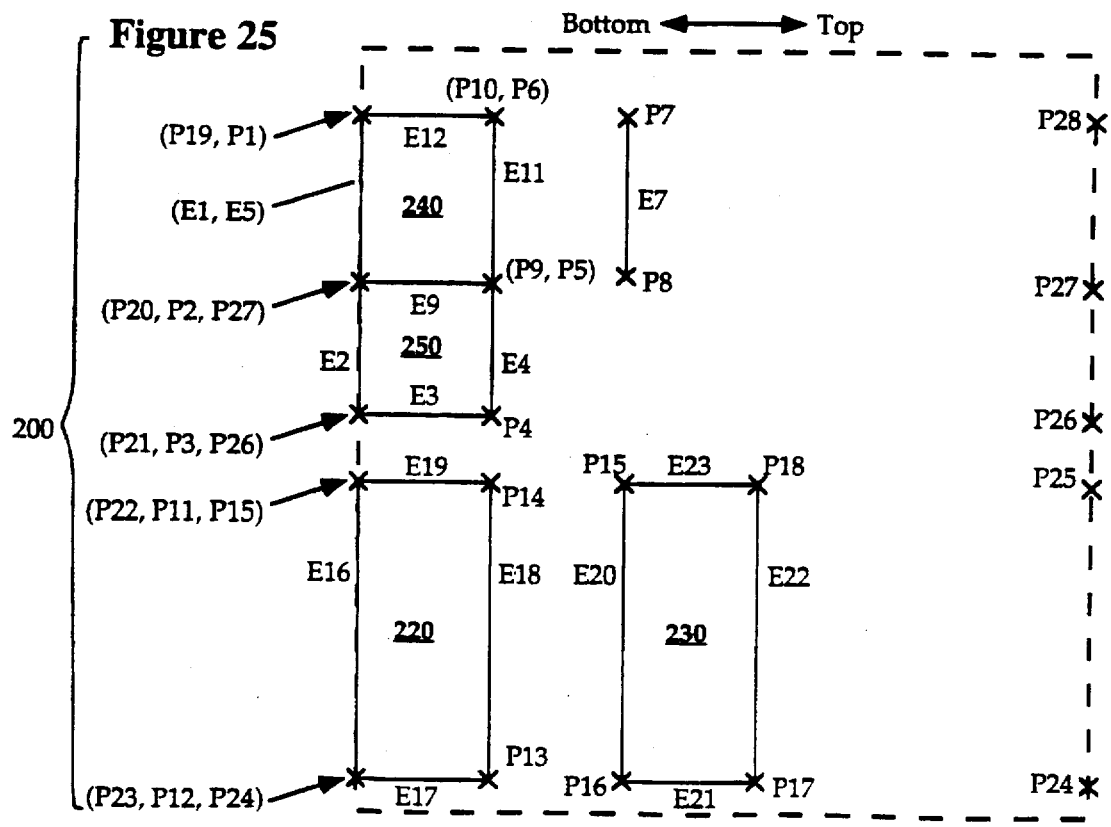
Figure 26:
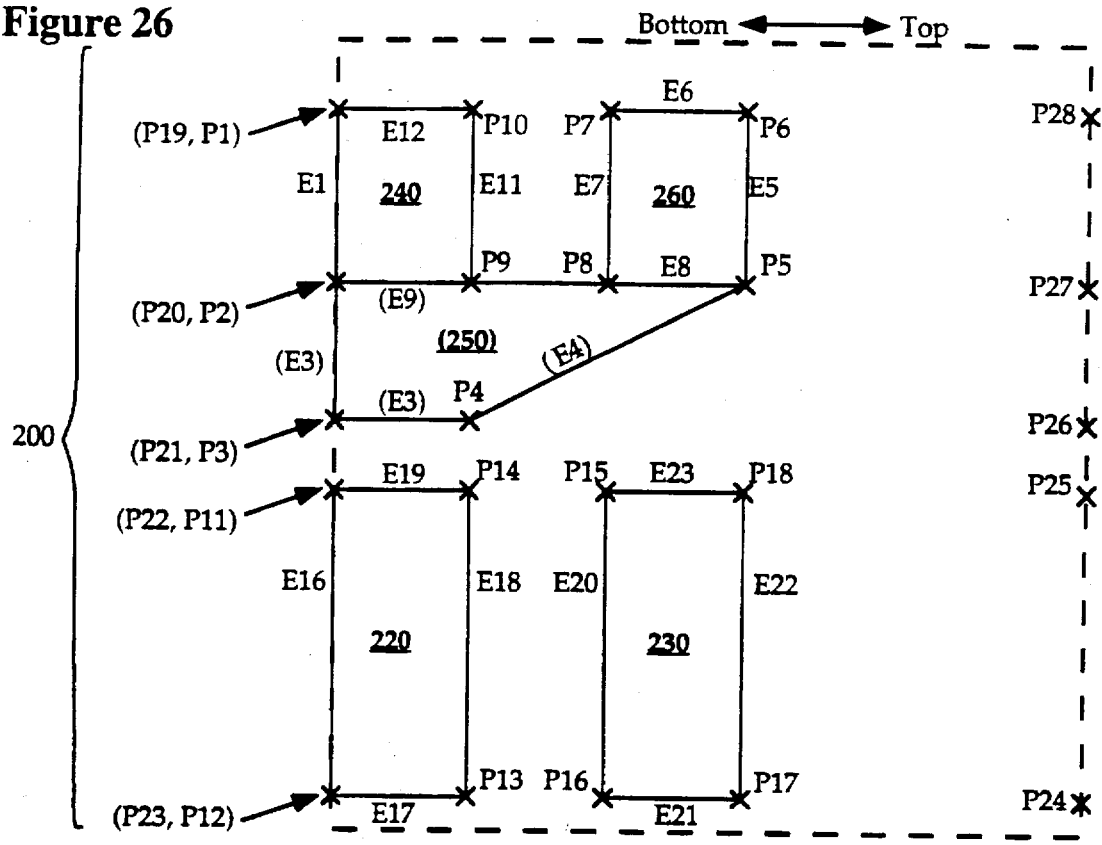

Then cell 230 is processed by the All Cells routine in the same manner, resulting in the layout shown in FIG. 25. Next, cell 260 is processed, which expands it out to the minimum allowable width, as shown in FIG. 26. By comparing FIG. 20 with FIG. 26, it can be seen that both cells 230 and 260 have been diminished in width.

Figure 27:
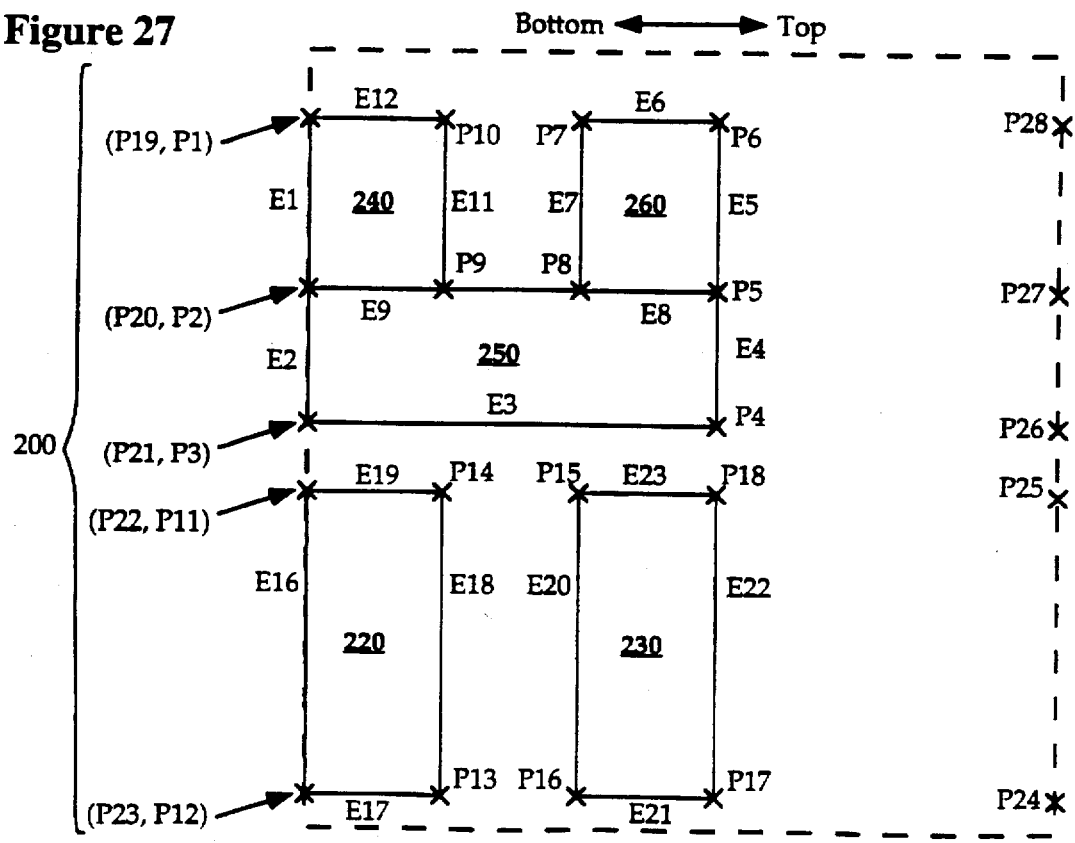

In the processing of cell 260, note that point P5 has been pulled to the right, i.e. its $\Delta x$ offset has been adjusted at this point (along with that of P6) to give the cell the correct minimum width for the material of the cell. This would distort cell 250, which shares point P5 with cell 260 (and thus the interim nonrectangular shape of 250 is shown in FIG. 26). When step 5.6 is encountered, it is determined that, as shown, P5 had previously been moved in the All Cells routine, so P4 is now moved to ensure that the edge E4 moves along with edge E5, resulting in the layout as shown in FIG. 27. (There are no further adjacent cells, so steps 5.7 and 5.8 have no effect.)

Figure 28:
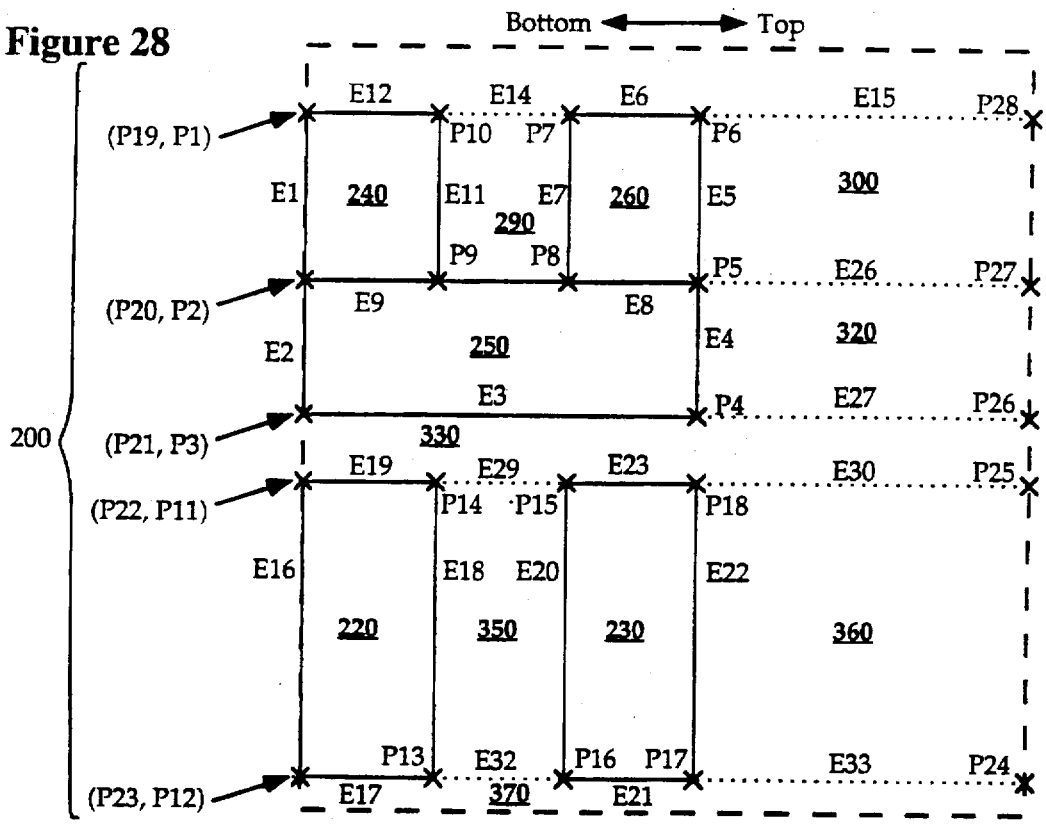
Figure 29:
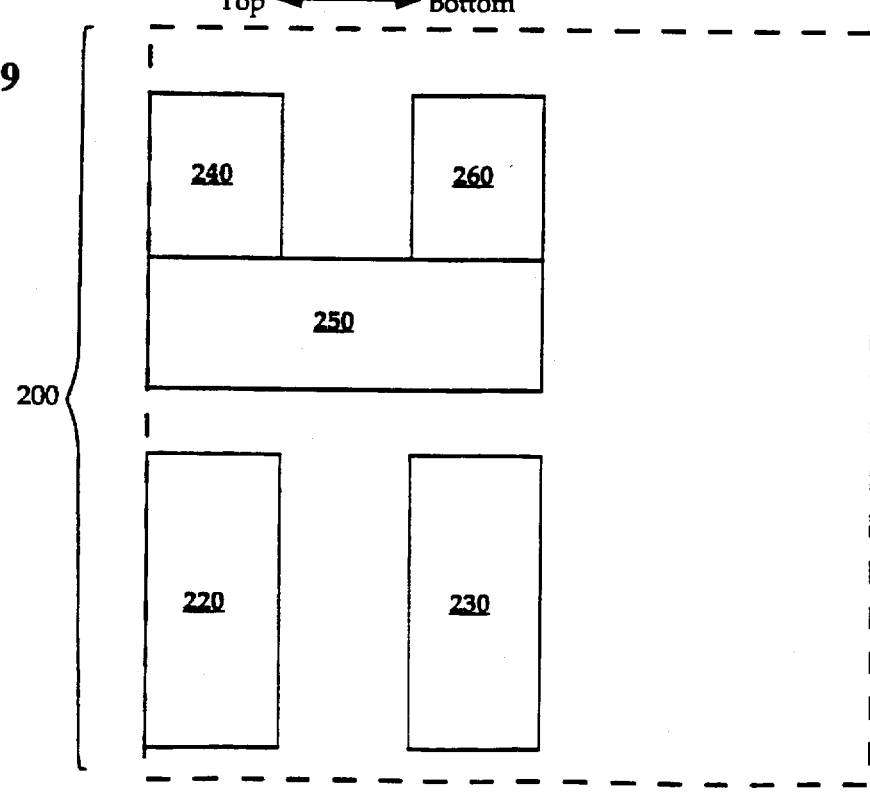
Figure 30:
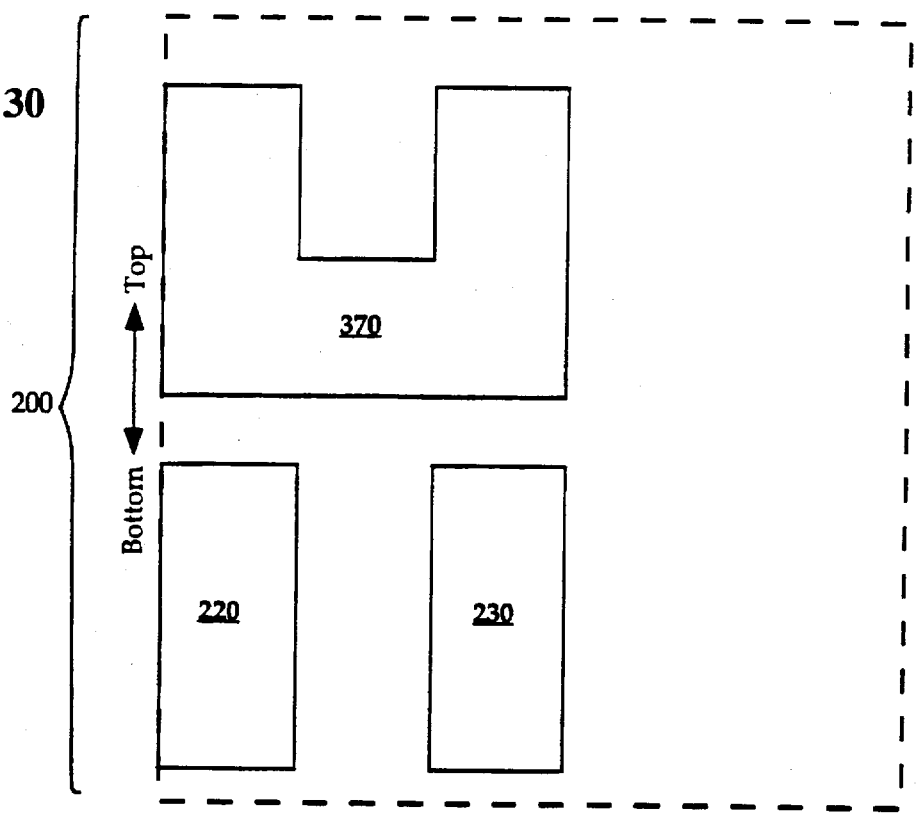

FIG. 28 illustrates the results of the processing to this point, including showing the empty cells which in the preceding figures were omitted for the sake of clarity. The All Cells routine has now been completed, and step 6 involves reversing the x-coordinate values so that lower x-values are to the right and higher x-values to the left; this makes the "top" to the left. The All Cells routine is repeated, except that the spacing subroutines are skipped, i.e. only adjusting the widths. Also, only the bottom edges are adjusted. For this particular layout 200, the result is identical to FIG. 28, with the "bottom" and "top" reversed as indicated in FIG. 29 (where the points and edges are unlabeled for greater clarity).

In step 7, the coordinate values are again flipped, which returns the layout to the configuration shown in FIG. 28. At step 8, the layout is unfractured, resulting in the configuration shown in FIG. 30, the three cells 240–260 having been combined into one cell 370. At this point, the connectivity data structure may be disposed of (or stored elsewhere for other purposes), since it will now be replaced by a new connectivity data structure generated for the y-direction, including the cells as fractured in the y-direction and the consequently generated boundaries, edges, points, and empty cells.

Step 9 is now carried out to repeat the process for the y-direction. In order to do this, the nonempty cells are recombined, and the connectivity data structure that was generated for the x-direction compaction may be disposed of. (The data structure may alternatively be saved for further processing if desired; but it is not needed for the y-direction compaction.)

Figure 31:
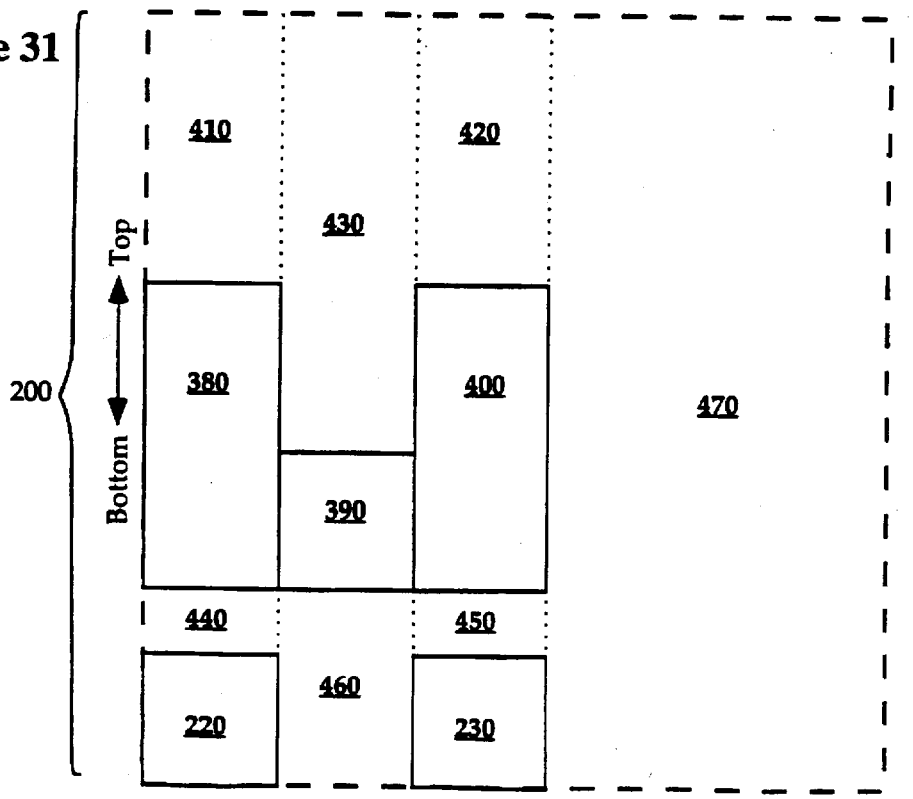

The layout is then fractured in the y-direction into cells 380–400 and 220–230 and empty cells 410–470; the result after completing step 7 for the y-direction is shown in FIG. 31. The y-direction procedure is as discussed above for the x-direction. After step 8, the unfractured layout (other than empty cells) is as shown in FIG. 32, where cells 380–400 have been recombined into cell 480.

Figure 32:
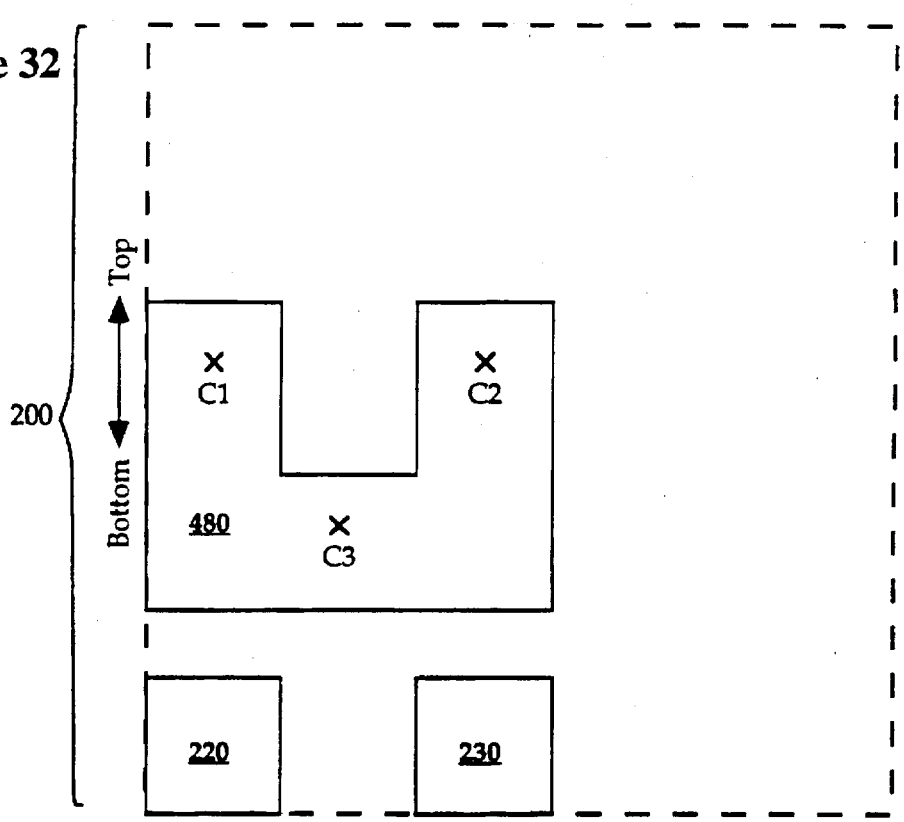

Step 10 is that of preparing the photolithography masks based upon the resulting layout shown in FIG. 32. In order to do this, the data defining the resulting layout is preferably put into a standard format used by many applications, such as Caltech Information Format (CIF).

Figure 19:
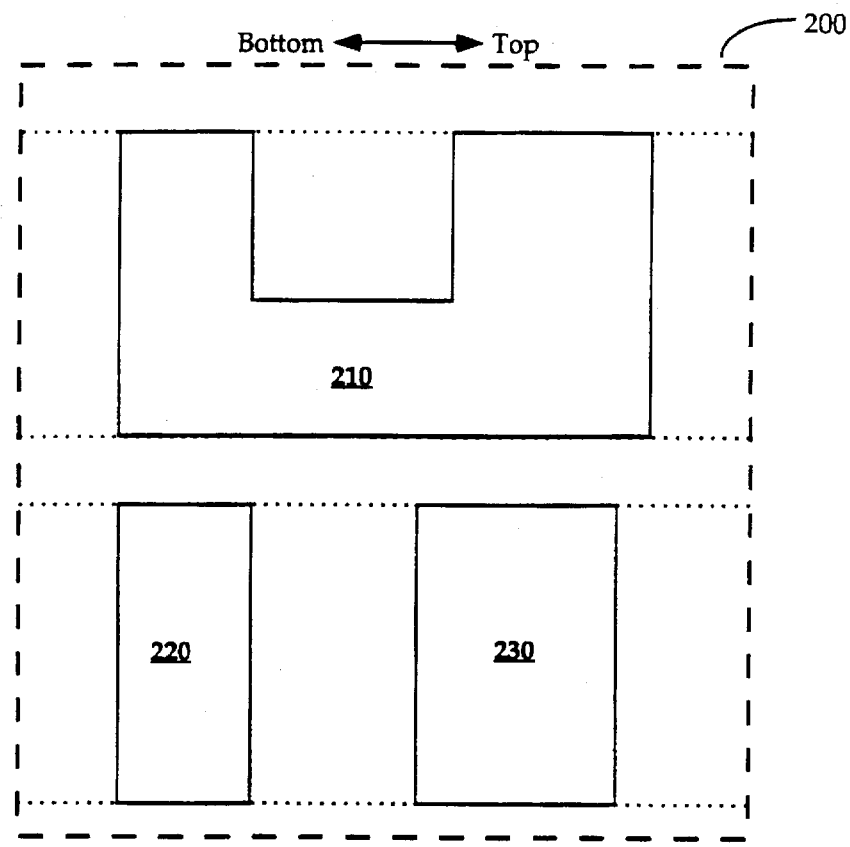

Note that, relative to the starting layout of FIG. 19, the layout of FIG. 32 is considerably more compact, surface areas have been diminished, so that overall the layout is more regular and requires less material to manufacture.

Figure 33:
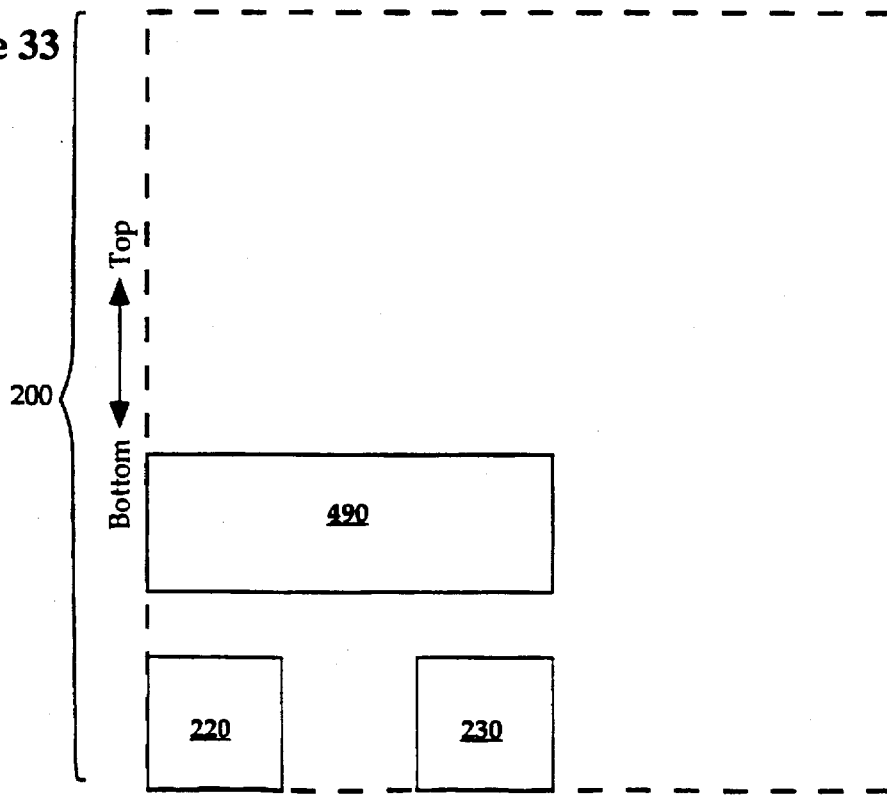

An assumption has been made relative to FIGS. 31–32, namely that there is some constraint preventing cells 380–400 being combined into a single cell 490 as shown in FIG. 33 (without the vertical legs of cell 480). Without such a constraint, the result after step 9 would be as shown in FIG. 33.

Such a constraint might, for instance, be the presence of contacts at points C1–C3 shown in FIG. 32. This would create adjacent cells for the cells containing those points, which would prevent the collapse of cell 480 (as with cell 490). Otherwise, the more complex U-shaped cell structure 210 would be greatly simplified into the linear cell 490 of FIG. 32.

As noted above, the flipping of the coordinates did not make a difference for the particular layout modification depicted in FIGS. 19–33, either for the x-direction or for the y-direction. However, for many layout configurations the flipping of the coordinates is important to minimizing the layout area.

Figure 34:
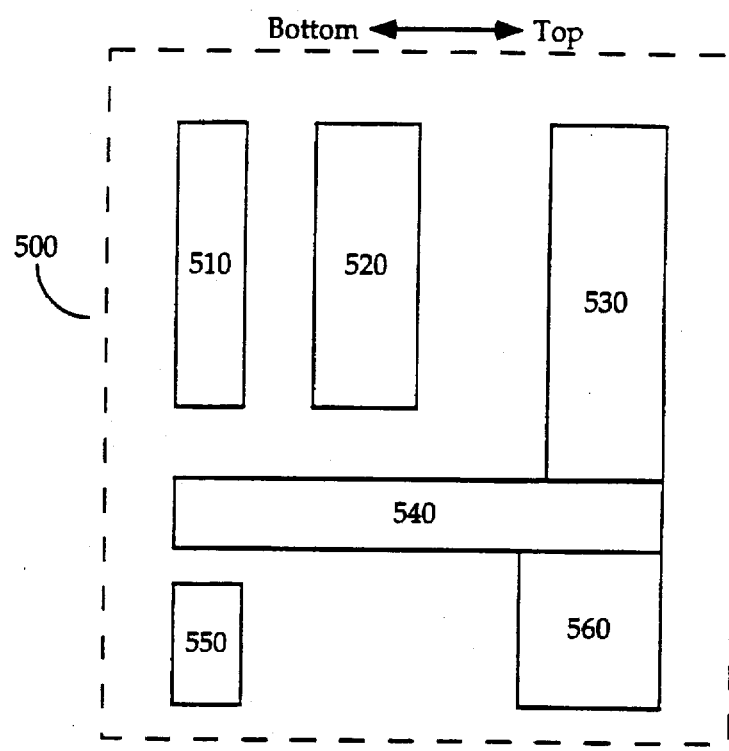
FIGS. 34-37 illustrate the efficacy of the coordinate-reversal feature of the method of the invention.

An illustration of such a case is given in FIGS. 34–37, where FIG. 34 represents layout 500 that is to be minimized, including cells 510–560. After following the method of Appendix C up through step 6 (for the x-direction), the layout appears as in FIG. 34, with the left edge of cell 560 being the minimum allowable distance from the right edge of cell 550. Cells 520–540 have all been reduced in width. (For the sake of this explanation, the fracturing of the cells is maintained in these figures; i.e. step 8 is bypassed to demonstrate the effect of the reversal of coordinates.)

Note that cells 510–530 must be positioned with minimum intercell spacing, and the top edges of cells 530 and 540 must be kept adjacent (i.e. share an endpoint), so that the right edge of cell 540 cannot be any further to the left than shown. Also, the top edges of cells 540 and 560 share an endpoint, so that cell 560 cannot be moved closer to cell 550. The first pass of the All Cells routine leaves the left edge of cell 560 where shown in FIG. 35.

Figure 36:
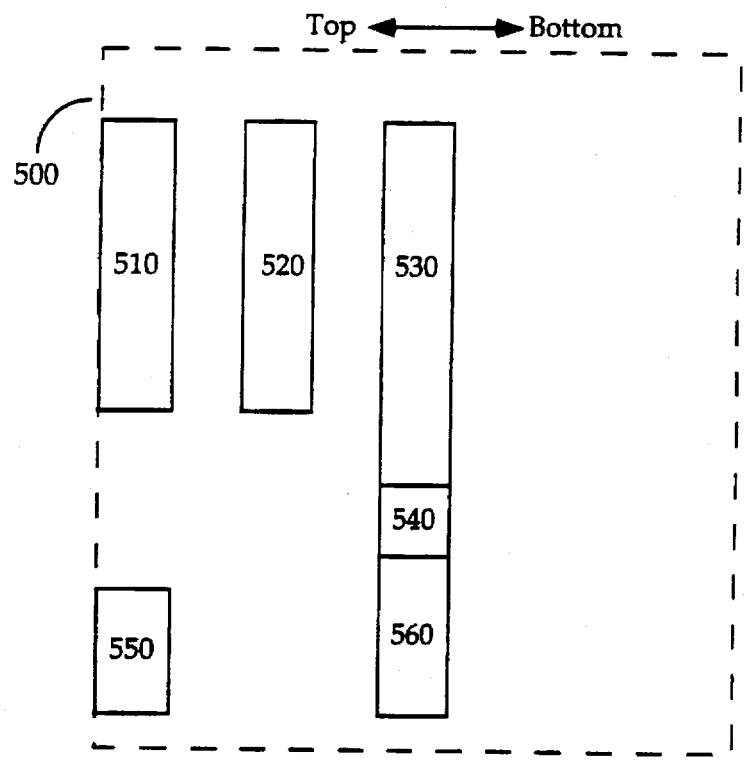

When the values of the x-coordinates are reversed in step 7, however, and the All Cells routine is run again, this edge is pulled back towards cell 560, as shown in FIG. 36. After running the All Cells routine in the y-direction, the resulting layout appears as in FIG. 37 (assuming, as in the example of FIGS. 19–33, that there is some constraint, such as contacts, preventing cells 530 and 560 from simply being merged into cell 540).

Figure 35:
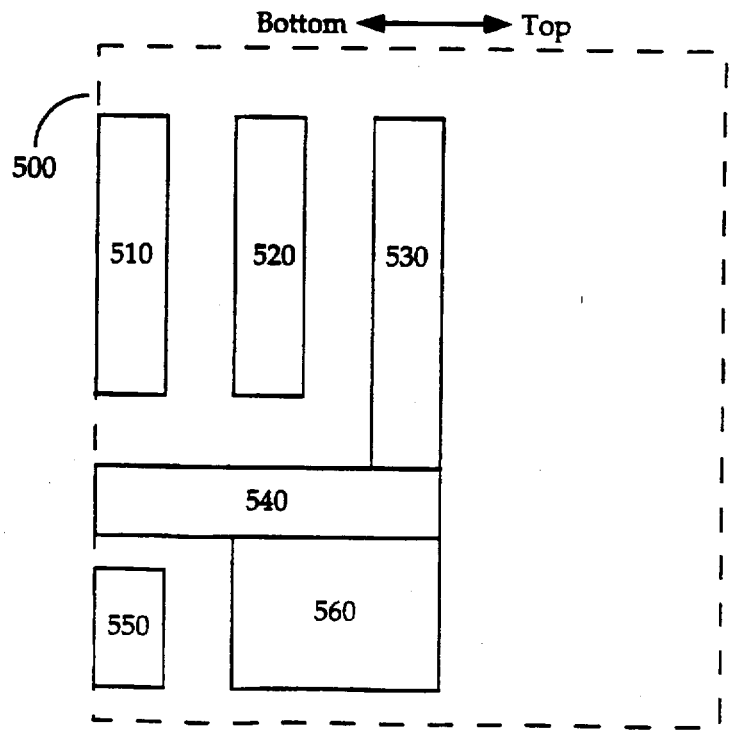
Figure 37:
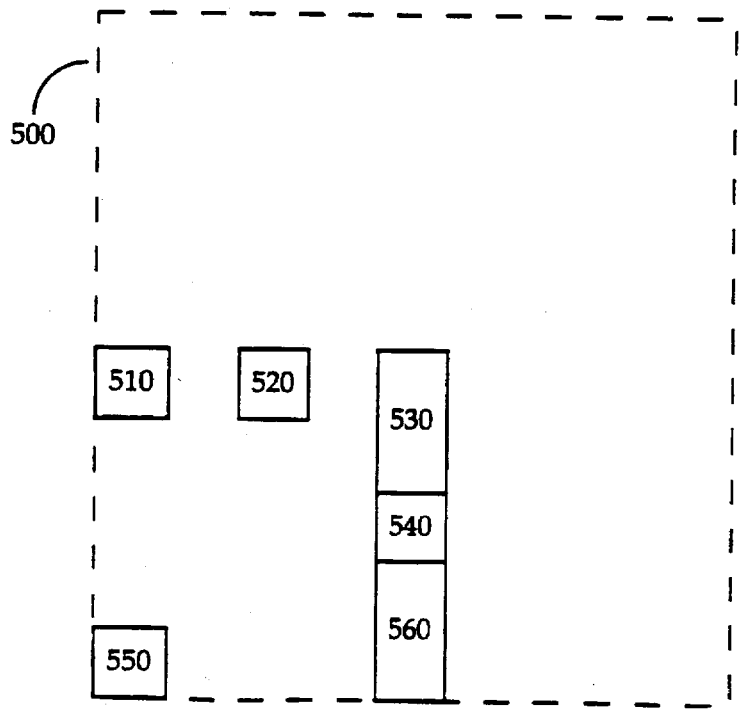

The width of cell 540 may, if desired, be intentionally left as in FIG. 35 by various means. For instance, a minimum width may be entered by the user, or a constraint may be entered that the left edges of cells 510, 540 and 550 must be aligned. In such cases, cell 540 will not be collapsed as shown in FIGS. 36–37.

Method for Wire Length Minimization: Appendix D

A modification of the procedure may be used to handle another situation that can arise in certain layout configurations. The modification appears in the pseudocode of Appendix D (which is used in conjunction with the method of Appendix C), and its application to a circuit layout is illustrated in FIGS. 38–51.

Figure 38:
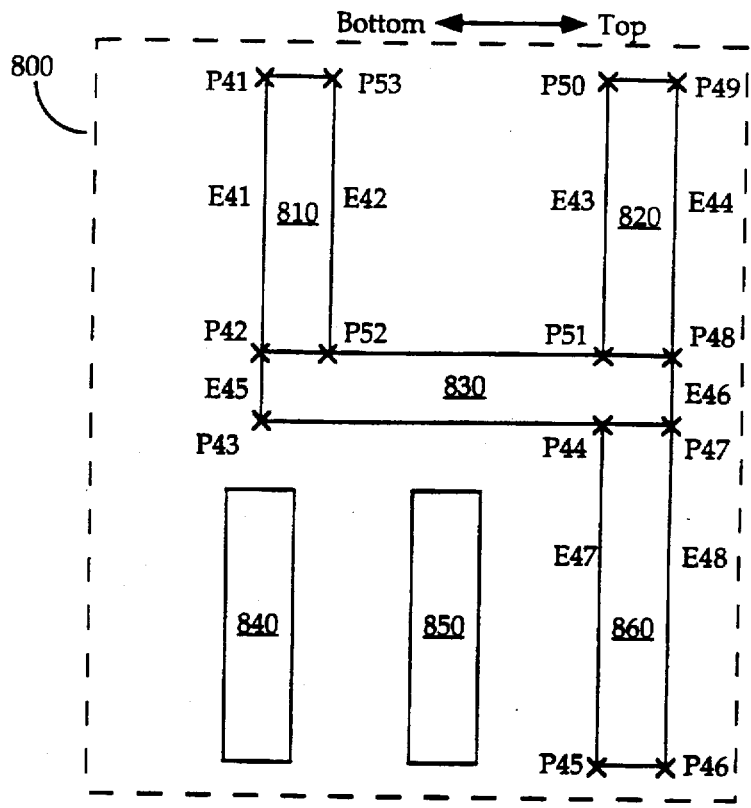

FIG. 38 shows a layout 800 having six solid cells 810–860. This layout has already been fractured in the horizontal (x-) direction, and for the sake of clarity the empty cells are not shown in the figures relating to the instant discussion. In addition, for the purposes of the example of FIGS. 38–51, the y-direction compaction will not be used; it is sufficient to demonstrate the method of the invention if the example is confined to x-direction compaction.

Figure 39:
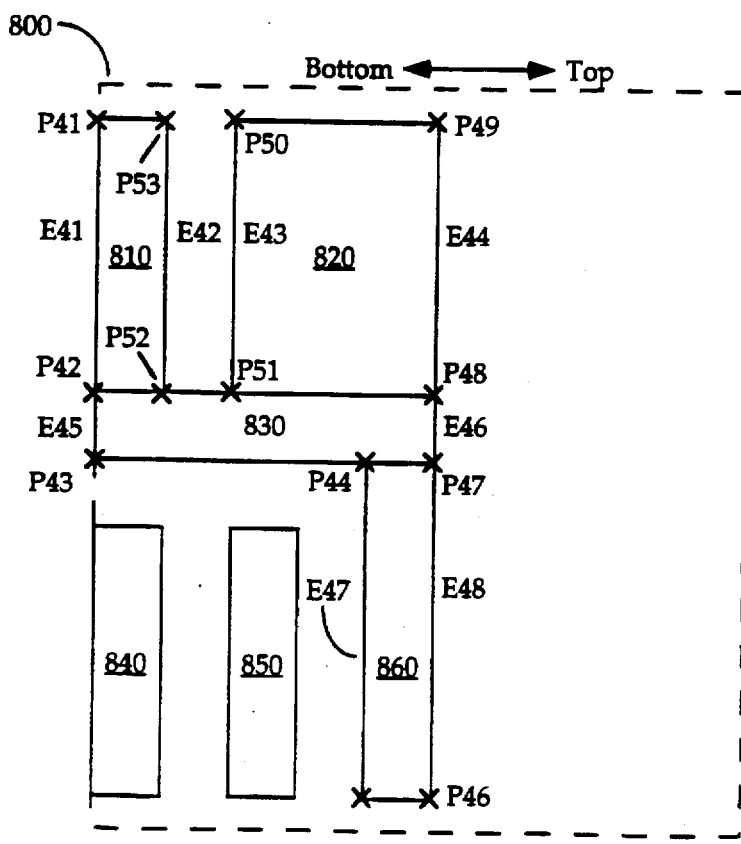

The method of Appendix D may be referred to as a "wire length minimization" method, since in addition to compacting area of the layout, it also ensures that wires that connect features of the layout are shortened as much as possible. If the layout 800 of FIG. 38 is the starting point, after processing by the All Cells routine (the first time through), it will appear as in FIG. 39, with the cells brought to the lowest x-coordinate position (i.e., here the left edge of the layout as shown in FIG. 39), and cell 820 in an enlarged state. In step 6 of Appendix C, the coordinates are flipped and the All Cells routine is executed again, which would produce the layout shown in FIG. 40, once steps 6–7 are completed. (Steps 8–9 will not be carried out for this example, as indicated above.)

Figure 40:
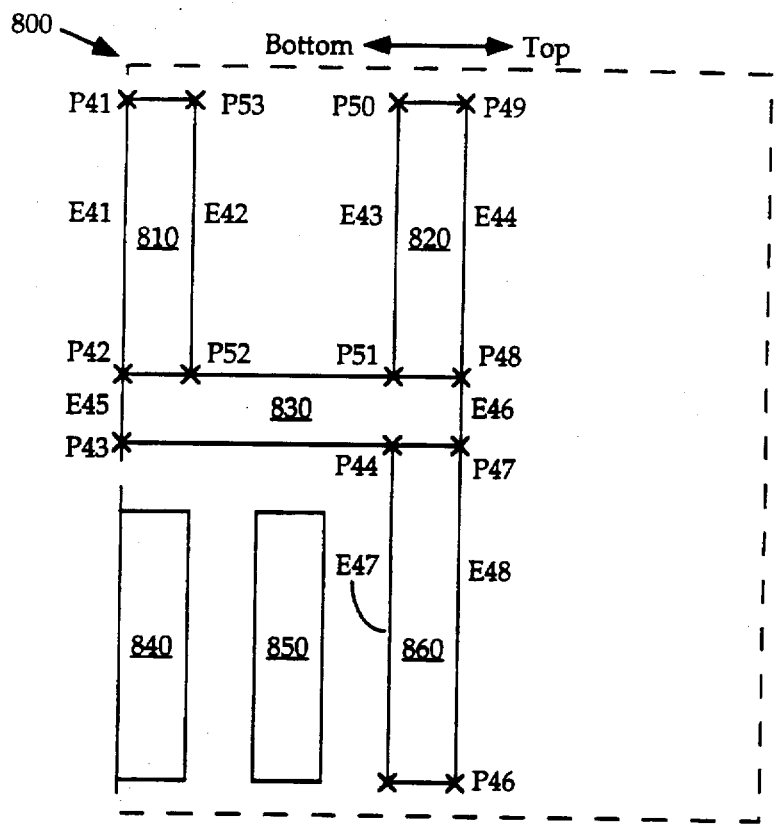

However, ideally cell 830 in FIG. 40 should be shortened, since there is no advantage in having it be as long as shown. The following method accomplishes this, and as will be seen shortens cell 830 so that the resulting layout appears as in FIG. 51.

In Appendix D, steps 11–16 summarize the steps that take place in the All Cells routine of Appendix C. It is helpful to discuss the All Cells routine at the somewhat higher level of steps 11–16. Thus, Appendix C will not be addressed in detail in connection with FIGS. 38–51; but the first pass of Appendix C serves as the basis for steps 11–16 of Appendix D, and steps 6–9 (the second pass) of Appendix C are effectively replaced by steps 17–22 of Appendix D.

In the following discussion, at certain points the moving of "edges" and "cells" is discussed; in each case, this means moving the points that define such edges and cells. When necessary for clarity or accuracy to discuss the moving or adjusting of objects on a point-by-point basis, this will be done.

In the method of Appendix D, cells that are already at their minimum widths will not be adjusted. Cells are processed in the order of lowest coordinate value (for the dimension in question, i.e. either x or y) to highest. When the "bottom" is on the left, this means processing from left to right; when the coordinates are flipped, this puts the lower values (or "bottom") on the right see FIG. 41), and the cells are processed from right to left. Thus, after the coordinate reversal of step 17 (corresponding to FIG. 41), the cells will be processed in the order 820-830-860-850-810-840.

Referring to the starting point of FIG. 38, steps 13–16 of Appendix D correspond to the first pass of the All Cells routine of Appendix C, and thus produce the revised layout of FIG. 39. As in the earlier examples, the $\Delta x$ values are stored, and the original coordinates for the points are also stored. As noted at the beginning of Appendix D, in order for an offset to be assigned at any stage of the method, that offset must result in a position of the point in question having a net x- (or y-) value at least as great as the net value if the new offset were not used. This prevents points from being reassigned $\Delta x$ or $\Delta y$ offsets that are not as great as earlier-assigned offsets.

Figure 41:
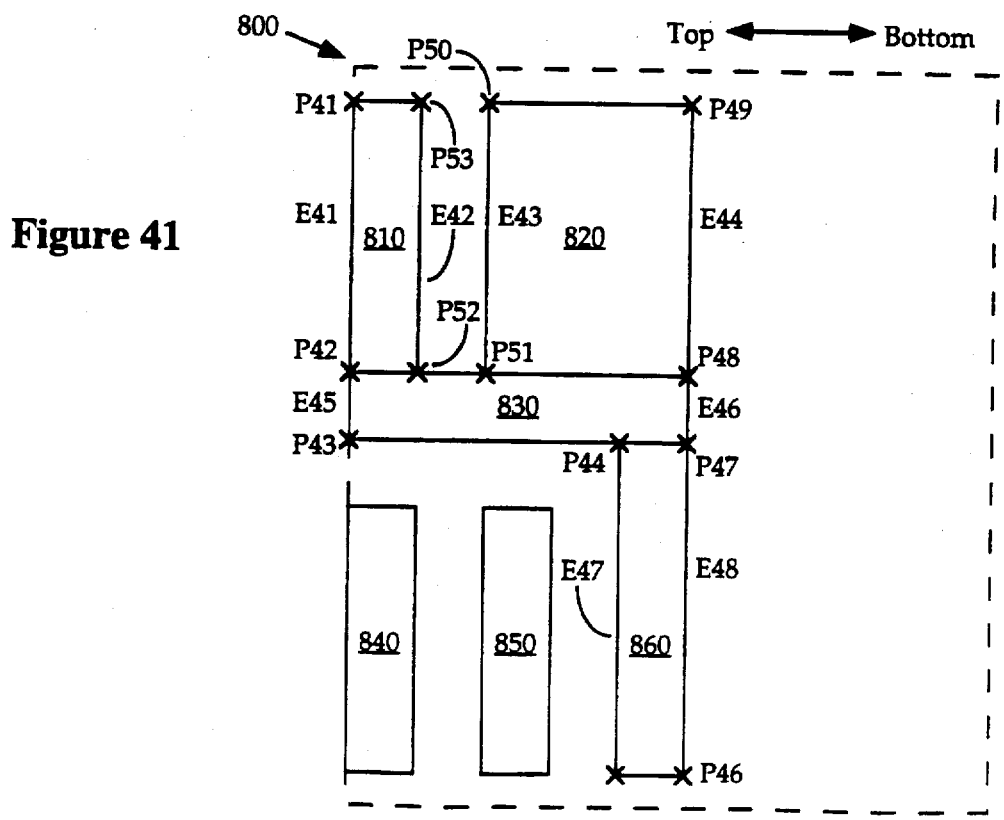

In step 17, the x coordinates are reversed, so that the layout has top and bottom as indicated in FIG. 41 (compare FIG. 38). At step 17A, all of the points of nonempty cells in the layout in FIG. 41 (including those for cells 840 and 850) are assigned new, temporary x-offsets that bring them all to the bottom (right) edge of the layout, as shown in FIG. 42. The original $\Delta x$ offsets are saved and will be used in the second pass (i.e. steps 18–21).

First processing cell 820, step 18 tests whether any point on its top edge (i.e. points P50 and P51 in the reversed coordinates of FIG. 41) has been moved in the second pass. At this point, the answer is negative, so at step 19 bottom edge E44 is moved to the position it was assigned in the first pass, i.e. its first $\Delta x$ is restored so that it is positioned as in FIG. 41; the result is shown in FIG. 43.

Figure 44:
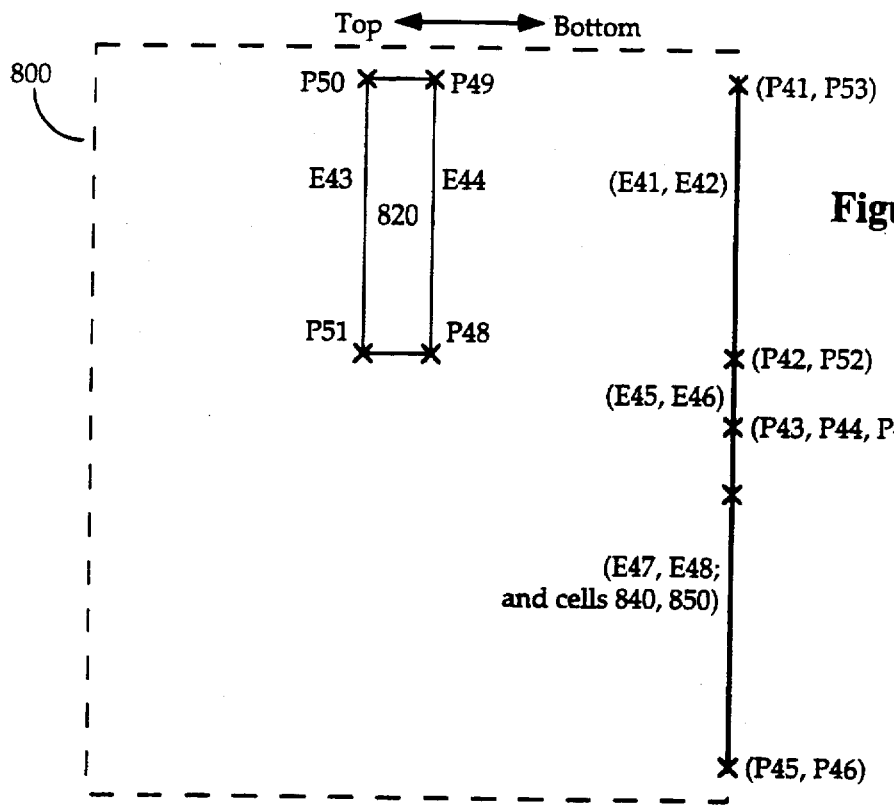
Figure 45:
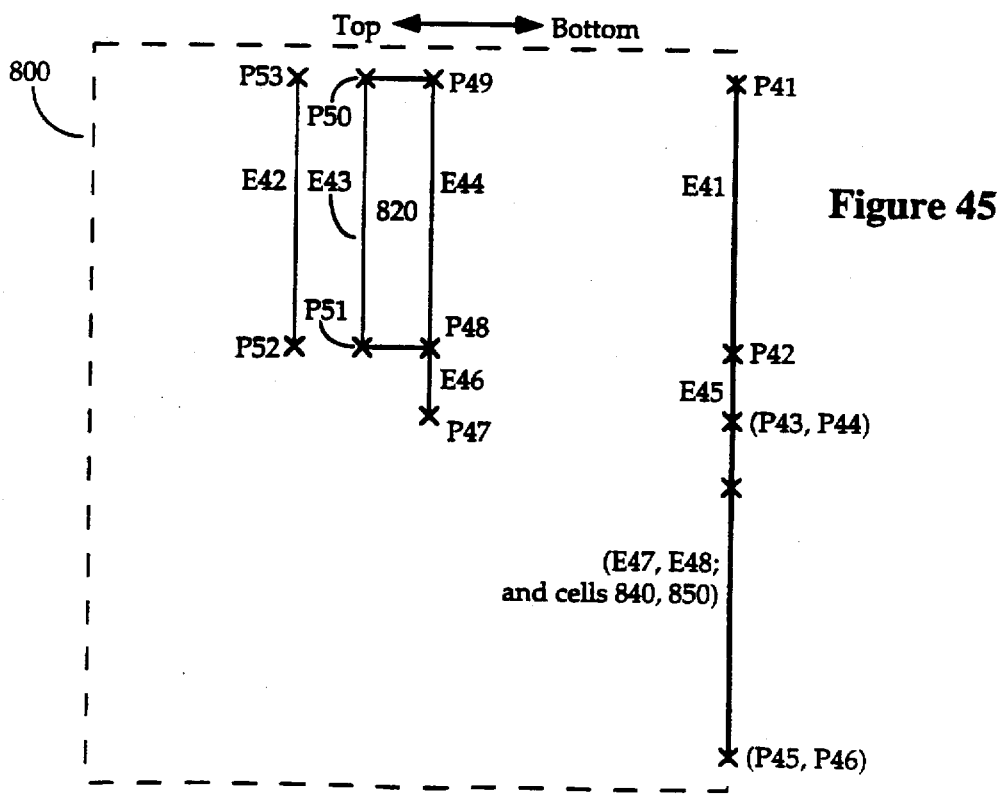
Figure 46:
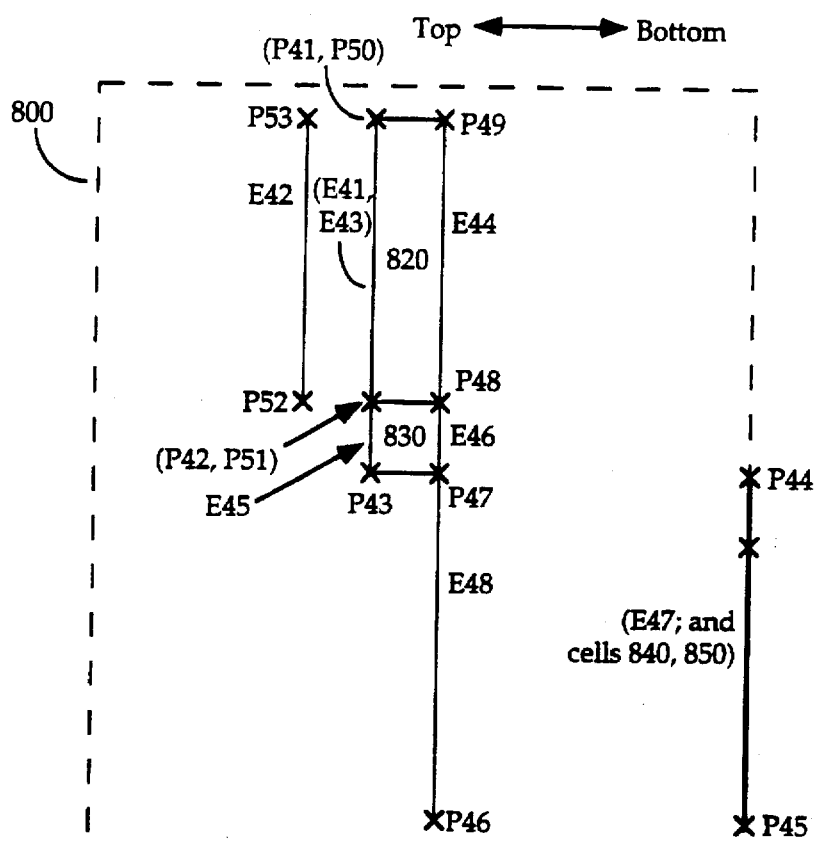

Step 20 leads the method into steps 14–16. At step 14, the top edge E43 (i.e., the points P50 and 51 defining the top edge E43) is moved to the design rules' minimum width from edge E44, as shown in FIG. 44. At step 15, cell 810 is found to be in front of the currently processed cell 820, i.e. at a larger x-coordinate. Its bottom edge E42, defined by points P53 and P52, is accordingly moved to be the minimum allowable space from edge E43, as shown in FIG. 45.

Returning now to step 21, the move for top edge E43 is to be recursively propagated to edges of cells having points along their top edges that are shared by the top edge E43 (in the input layout of FIG. 38, i.e. not taking into account the x-offsets). There are no such adjacent cells, so this step has no effect.

The top edge move distance is propagated to other adjacenct edges, because otherwise, when these cells are processed, they would still have the old move distances from the first compaction step. As a result, this old move distance would propagate to all adjacent cells. Since this previous move distance is greater than the new move distance, it would override it and result in stretching the minimized cells back to their original size as determined in the first compaction pass. Thus, step 21 is important in minimizing wire lengths.

This ends the second pass for cell 820, so cell 830 is processed next. At step 18, the answer is negative, so at step 19 the first-pass value of $\Delta x$ is used to move the bottom edge E46 of cell 830 to the position shown in FIG. 46. Next, at step 14 (reached via step 20), top edge E45 is moved out to be the minimum allowable width from edge E46. Step 15 has no effect, since there are no cells in front of cell 830.

Cell 830 has cell 860 as an adjacent cell (their bottom edges E46 and E48 sharing endpoint P47); however, cell 860 has not been moved by the second pass operation, so step 16 is not carried out for cell 860. The program can determine whether any point of a cell has been moved, i.e. assigned a $\Delta x$ offset, by assigning it a "move" flag. This can be stored in the data structure's point table 124 as move flag 188. Flag 188 is reset (i.e. indicates that no move has been assigned) both at the beginning of the procedure of Appendix D (and likewise at the beginning of Appendix C), and at the start of the second pass of Appendix C. Other, equivalent manners of determining whether the points have been assigned $\Delta x$ offsets in the second pass operations may be used.

Figure 47:
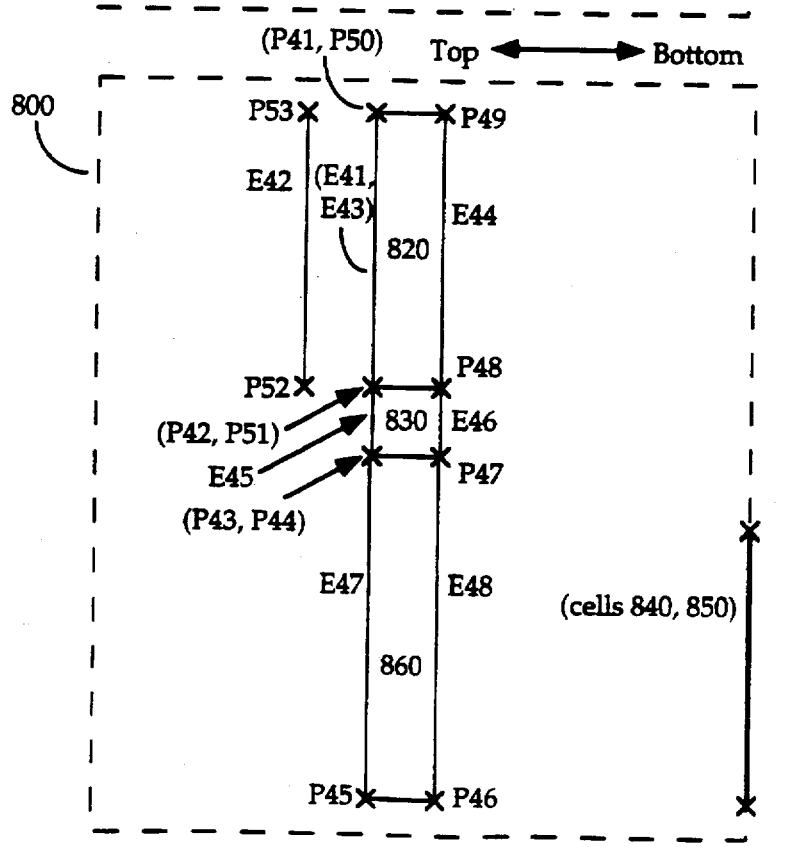

Still at step 16 in the processing of cell 830, the repositioning of the top edge E45 to the position shown in FIG. 47 also causes the repositioning of adjacent top edge E41 (see the original layout position of FIG. 38) of cell 810. For the moment, then, edge E41 is moved to the position shown in FIG. 46.

This completes the processing of cell 830, the method now processes cell 860. Step 18 is negative, so at step 19 bottom edge E48 is moved to the position shown in FIG. 46 (and FIG. 39). Step 14 then moves the top edge E47 of cell 860 out to minimum width distance from edge E48, resulting in the configuration shown in FIG. 47. Note that, although at this interim stage edges E45 and E47 are collinear, they are not adjacent by the definition of this procedure, since they do not share any common points (but have separate endpoints P43 and P44, respectively).

Step 15 will now bring the bottom edge of cell 850 out to the minimum allowable spacing distance from edge E47. Edge E47 has no adjacent edges, and edges E46 and E44 are already collinear with edge E48, so step 16 has no effect.

Step 21 also has no effect, so the method now processes cell 850. Step 18 is negative, and step 19 has no net effect, since its bottom edge E48 has just been moved by step 15 (see preceding paragraph) to the same position to which step 19 would now move it.

Figure 48:
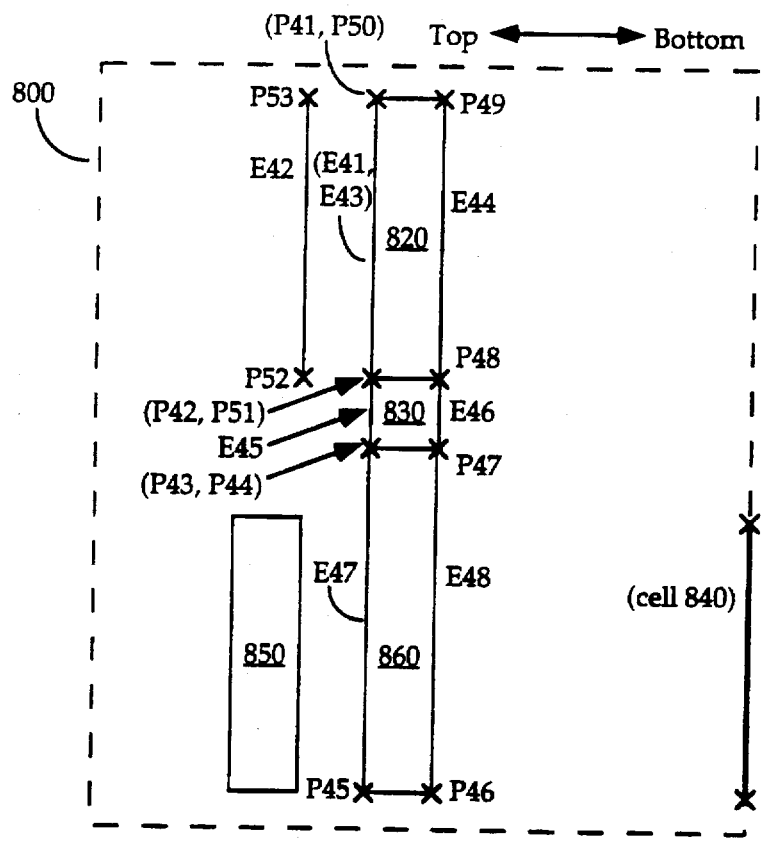

Step 14 then assigns the minimum-width move $\Delta x$ offset to the top edge of cell 850, which results in cell 850 being positioned as shown in FIG. 48.

Figure 49:
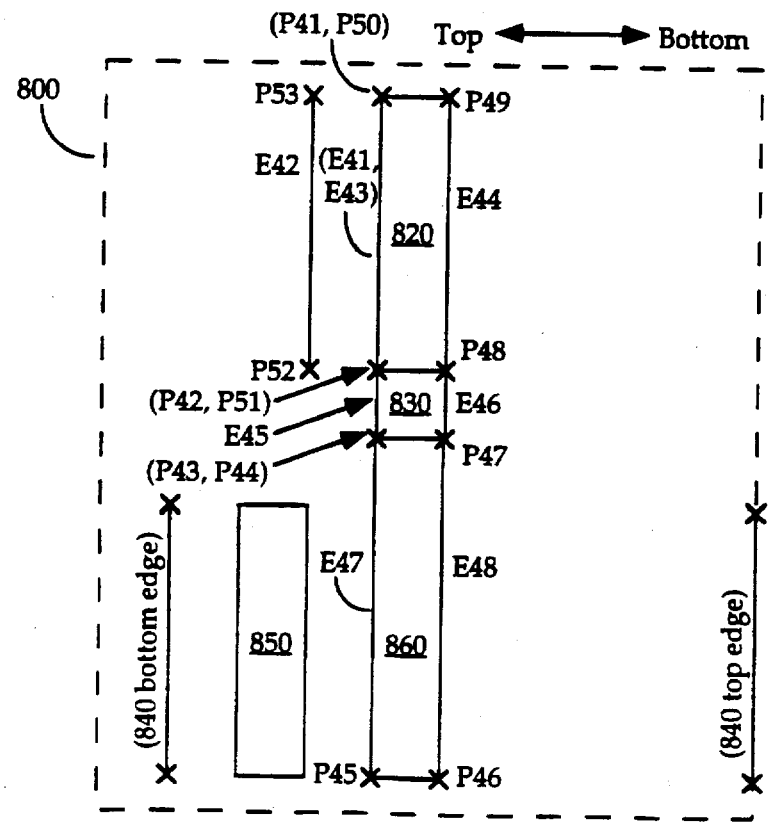

Step 15 brings the bottom edge of cell 840 out in front of cell 850, as shown in FIG. 49. Step 21 has no effect, so completing the processing of cell 850.

Now processing cell 810, step 18 determines that the top edge E41 has been moved by the second-pass operation (i.e. determines that it has a point whose move flag has been set). In fact, the edge 41 offset is presently assigned such that it sits in the position shown in FIG. 49. The subroutine of steps 18.1–18.6 in Appendix D provide the detail of how step 18 is carried out.

Steps 18.1–18.3 list the conditions that must be fulfilled for this subroutine to be carried out. First, the top edge (e.g. top edge E41) must not be touching a nonempty, i.e. its associated boundary (which is coextensive with edge E41) must not be adjacent to a boundary of a nonempty cell. Since the cell to the left of edge E41 is empty, this condition is fulfilled.

Step 18.2 states again the requirement that at least one point on the top edge of the current cell must have been assigned an offset during the second pass operation. This is true for cell 810. In the particular embodiment discussed in step 18.2, the test takes the form of whether either endpoint of the top edge in question has an assigned offset of some value other than "negative infinity", which is simply the indicator for the offsets assigned in step 17A to bring all of the points to the bottom edge of the layout. It could also be referred to as an offset of $\Delta x=-X$ (or "$-\infty$"), where X is the absolute offset of the point in question (as in the original, unaltered layout of FIG. 41), and thus $-X$ (or "$-\infty$") is exactly the value necessary to "collapse" the point in question to the x=0 coordinate of the layout.

Step 18.3 requires that the move distance (i.e. new offset) that has been assigned to a point of the top edge of the current cell be less than the $\Delta x$ offset that was assigned in the first pass operation, which has been stored as described above. A comparison of the positions of edge E41 in FIG. 39 (resulting from the first pass operation) and FIG. 49 (showing the erstwhile position for edge E41 at the current stage of the second pass operation) shows that this condition is fulfilled, i.e. that the $\Delta x$ offset in the second stage results in a lower x-coordinate for edge E41 than the $\Delta x$ offset from the first stage. Accordingly, step 18.3 yields an affirmative, and the remaining substeps 18.4–18.6 of subroutine/step 18 can be carried out.

Step 18.4 calculates the difference between the first and second pass $\Delta x$ offsets mentioned in the preceding paragraph. This difference is used to calculate a new offset for the bottom edge E42 of cell 810, which if actually assigned to edge E42 would bring it to the right of the position of edge E41 shown in FIG. 48.

However, as discussed in step 18.6, the general rule must be followed that a new $\Delta x$ offset must yield a greater resulting x-position than a previous $\Delta x$ offset, in order to actually be implemented. Since the new offset for edge E42 calculated in step 18.4 would place that edge atop the position shown for edge E44 in FIG. 49, and edge E42 already has a tentative (second-pass) $\Delta x$ offset placing it the position shown therefor in FIG. 49, at a higher (further left) x-position, the offset calculated in step 18.4 is rejected.

Step 18 is now complete. In this particular case, nothing has changed for its bottom edge E42; however, the processing of cell 810 by step 18 has had the effect of preventing the edge E41 from being reassigned its first-pass $\Delta x$ offset (to its farther-left position of FIG. 39), which would have occurred if step 19 had been executed. Other layout configurations would result in step 18 having an effect on the offset value for a given bottom edge.

Figure 50:
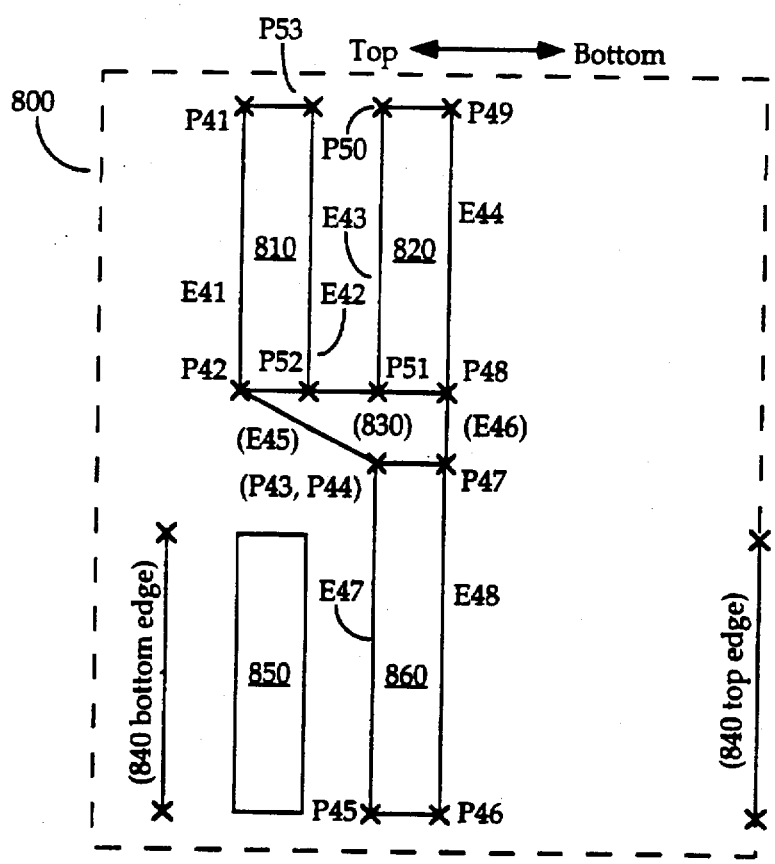

Proceeding to step 20 for cell 810, i.e. to step 14, the top edge E41 is now moved to the position shown in FIG. 50. Note that point 42, shared with edge E45, is brought forward. Step 15 has no effect.

Figure 51:
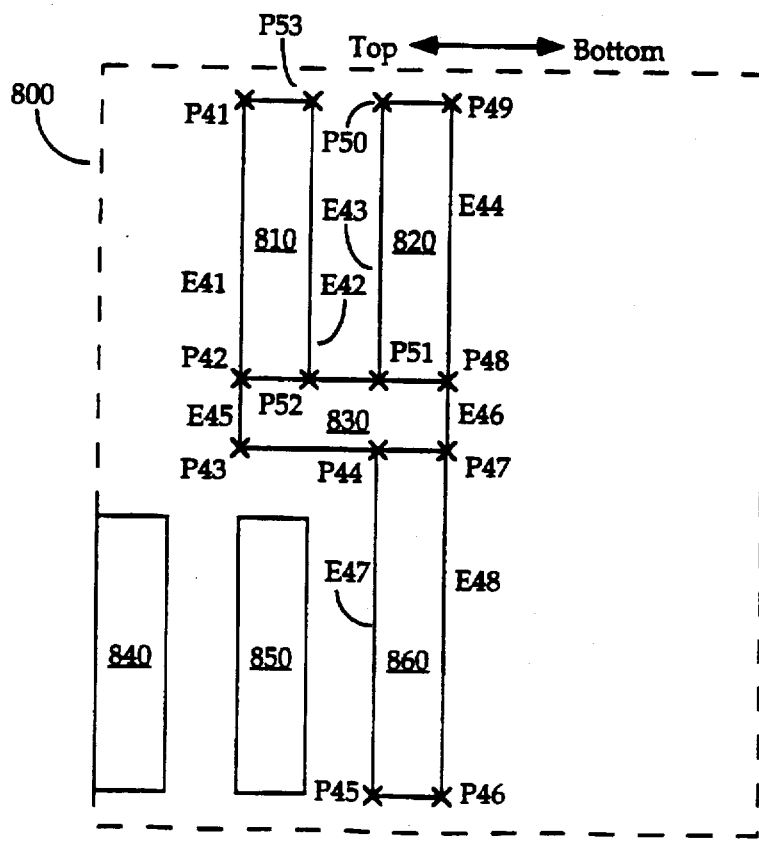

Step 16 brings out the other point P43 of edge E45, thus reconfiguring cell 830 as shown in FIG. 51. Step 21 has no further effect, since edge E45 has already been brought out by step 16.

Finally, cell 840 is processed. Step 18 yields a negative, so step 19 moves the bottom edge as indicated; however, there is no net effect on the bottom edge of cell 840, because it was already brought forward by step 15 during the processing of cell 850.

Step 14 assigns the top edge of cell 840 an offset necessary to place it the minimum distance from cell 840's bottom edge, resulting in the position for cell 840 shown in FIG. 51. There are no adjacent cells, so steps 16 and 21 have no effect.

This completes the All Cells routine in the x-direction. Step 21A reflips the x-coordinate values so that the "bottom" is again on the left, and recombines the cells to ready them for fracturing and processing in the y-direction (which will not be further treated here, but is procedurally the same as for the x-direction).

A comparison of the layout 800 as in FIG. 51 (resulting from the method of Appendix D) with that in FIG. 40 (which would result from the application of the method of Appendix C) shows that, for certain layouts where some cells have their repositioning constrained by the positions of other cells, the method of Appendix D results in minimized wire lengths. In this example, the wire represented by cell 830 has been shortened by one cell width and one spacing width, so that it is 40% shorter than it would otherwise have been.

Generalization of the Method

The present invention involves several important procedural and structural features that allow the compacting of Appendix C and the optimal wire length minimization of Appendix D. The data structure of FIG. 2 is central to the invention, particularly the use of points shared by edges and pointers to logically relate the objects via their boundary, cell and point fields. This makes the iterative processing of the edges (and hence the cells) through inspection of shared boundaries and points of edges very efficient, obviating a need for the system to do a complete search of the database in order to locate related and adjacent objects.

The use of the temporary $\Delta x$ and $\Delta y$ offsets is also advantageous, since it allows the system to optimize the layout iteratively, because the original coordinates of the points are not disposed of until the compacting or wire minimization is complete, so that the $\Delta x$ or $\Delta y$ offsets can be changed at any time during processing if a new and more desirable position for a given object is arrived at.

The general approach is of beginning at one end of the layout and methodically proceeding to the other end, all the while propagating offsets to objects in front of and adjacent to the current object, taking the edges one at a time and applying the width and spacing rules at the appropriate points. The pseudocode of Appendices B–D and connectivity structure of FIG. 2 provide one implementation of the method, but of course other specific implementations, using the above features, may be developed straightforwardly, given the above teaching. For example, the exact manner in which the layout data is stored is not important, so long as the data for each cell has the required links to its related and adjacent cells, and as long as the data representing shared boundary edges is similarly shared. Similarly, the exact manner in which design rules are applied to each cell could be varied without changing the aspects of the present that make it computationally efficient, and the particular manner of methodically treating the edges of cells and applying the design rules to these edges and cells may have many variations that utilize this approach.

Appendix A: Examples of design rules

WIDTH DESIGN RULES

| Cell-Type1 | Cell-Type2 | Cell-Type3 | Width (80 units = 1 micron) |
|---|---|---|---|
| empty | nwell | empty | 500 |
| empty | pwell | empty | 500 |
| empty | ndif | empty | 100 |
| empty | pdif | empty | 100 |
| empty | nwell | ndif | 340 |
| empty | nwell | pdif | 580 |
| empty | pwell | ndif | 580 |
| empty | poly | empty | 120 |
| pwell | nwell | ndif | 340 |
| nwell | pwell | ndif | 580 |

-continued

Appendix A: Examples of design rules

| empty | poly | ndif | 120 |
|---|---|---|---|
| empty | pdif | poly | 100 |
| empty | poly | pdif | 120 |
| empty | ndif | ndif-poly | 120 |
| empty | pdif | pdif-poly | 120 |
| empty | poly | ndif-poly | 120 |
| ndif | nidf-poly | ndif | 120 |
| empty | poly | pdif-poly | 120 |
| ndif | ndif-contact | ndif | 120 |
| pdif | pdif-contact | pdif | 120 |
| poly | ndif-poly | poly | 100 |
| empty | poly | poly-contact | 60 |
| empty | pdif | metal2-via | 0 |

Part 2: SPACING DESIGN RULES

| Cell-Type1 | Cell-Type2 | Space |
|---|---|---|
| nwell | nwell | 1100 |
| ndif | ndif | 160 |
| pdif | pdif | 180 |
| pdif | ndif | 340 |
| poly | ndif | 60 |
| poly | pdif | 60 |
| poly | poly | 120 |
| ndif | ndif-poly | 0 |
| pdif | ndif-poly | 0 |
| ndif | pdif-poly | 0 |
| pdif | pdif-poly | 0 |
| metal | metal | 120 |
| metal2 | metal | 140 |

Appendix B: Pseudocode for Ray Tracing Process

1. Receive inputs to search routine:
   Cell Pointer: cell from which ray trace starts
   XS, YS: starting point from which search is performed.
   SrchDrctn: direction in which to search, selected from the set +x, -x, +y and -y.
   SrchType: WIDTH or SPACING
   CurrentCell = cell identified by cell pointer.
   BeginCell.Type = Type of current cell
2. For WIDTH SEARCH DO: {
   3. If CornerCheck is being performed {Jump to Step 4 } (Internal CornerCheck spacing search ray trace must start in nonempty cell; if not, return.)
   --Inspect boundaries of current cell and locate the boundary of the current cell that intersects the specified ray.
   Set Bndry = top/bottom boundary which intersects ray
      (or Null if edge of layout is hit)
   Set P = point at which ray intersection occurs
      (or Null if edge of layout is hit)
   NextCell = Bndry's adjacent cell
      (or Null if edge of layout is hit)
   NextType = Type of NextCell
      (If NextCell = edge of layout, NextType = 0, or Null.)
   4. If NextType = BeginCell.Type {
   -- Perform cell transition (set new cell as current cell), and then repeat step 3.
   Current Cell = NextCell
   Go back to Step 3.
   }
   5. Return (P, Bndry)
End WIDTH SEARCH
}
6. For SPACING SEARCH DO: {
   7. If CornerCheck is being performed {Jump to Step 8}
      (CornerCheck spacing search ray trace must start in empty cell; if not, return.)
   -- for regular space search, check that neighboring cell is empty
   -- if neighboring cell is not empty, no spacing search can be performed for this cell in the specified direction.
   P = point XS,YS
   Bndry = top/bottom boundary that contains point P

Appendix B: Pseudocode for Ray Tracing Process (or Null if edge of layout is hit)
   NextCell = Bndry's adjacent cell (in the direction in which the ray points), or Null if edge of layout is hit.
   NextCell.Type = Type of NextCell
      (or 0 (Null) if edge of layout is hit)
   If NextCell.Type ≠ Empty: {Return (0, 0)}
   8. Inspect boundaries of current cell and locate the boundary of the next cell that intersects the specified ray.
   Set Bndry = top/bottom boundary which intersects ray and is not part of the cell from which it emanates.
   Set P = point at which ray intersection occurs
   NextCell = Boundary's adjacent cell.
   NextCell.Type = Type of NextCell
   If NextCell.Type = Null, return null pointer
   9. If NextCell.Type = Empty, repeat step 8.
   10. Return (P, Bndry, NextCell)
End SPACING SEARCH}

Appendix C: Pseudocode for Compaction Process

Data Preparation Steps

Definitions:
Backwards: in the negative coordinate dimension (i.e. x- or y-dimension). This is in the direction of the "bottom" of the cells, which changes with the reversal of the coordinate system.
Forward: in the positive coordinate dimension (i.e. x- or y-dimension). This is in the direction of the "top" of the cells, which changes with the reversal of the coordinate system.

0. Set Compaction Dimension to x:
   "Top" edges of each cell are initially those with largest x values.
   "Bottom" edges are initially those with smallest x values.
1. Fracture specified layout into trapezoidal strips (making new slices or lines only along the selected dimension).
2. Store the trapezoidal cells in the connectivity data structure.
3. Combine all occupied (non-empty) cells from all layers into a linked list and sort this list based on the lower corner of each cell, sorting by lowest x value when the compaction dimension is x, and sort by lowest y value when the compaction dimension is y.
4. For every point in the point table corresponding to a solid cell: assign an initial move distance that would move the point to the edge having the lowest coordinate value in the selected dimension of the layout.
   (This initially places all edges atop one another on the bottom edge of the layout; they will be re-expanded in subsequent steps.)

All Cells Routine

ALL CELLS: For each cell in the sorted cell list, DO:
Process cells in the order found in the sorted cell list (sorted by lowest-coordinate edges).
For all move distances: assign the new move distance to an object only if it results in the object being moved to a position having a greater coordinate value (x-value or y-value) for the moved object than the previously assigned move distance.
5.1 (a) For each point on each bottom edge of the current cell: set the assigned move distance to be the maximum move distance of all points on all bottom edges for the current cell.

(b) For each point on each top edge of the current cell: set the assigned move distance to be the maximum move distance of all points of all top edges for the current cell.

(Steps 5.1(a) and (b) normalize the cell, since all top edges and bottom edges must move rigidly and all bottom edges must move rigidly.)

Bottom Edge: For each bottom edge of the current cell, DO:

5.2 Apply spacing design rules:
  (a) For each point on the current bottom edge of the cell: use the Ray Tracing Routine to search backwards to determine whether the distance to the nearest edge of a non-empty cell meets the minimum spacing constraint; and if it does not, assign an appropriate move distance to move the point on the edge from which the ray emanates to meet the constraint.
  (b) For each external corner point: use the Ray Tracing Routine to search backwards for any corner-to-corner spacing constraints, using a ray starting at a point offset from the current cell and intersecting the next cell, and determine whether the distance along the ray to the next cell meets the minimum spacing constraint; and if it does not, assign an appropriate move distance to move the point from which the ray emanates to meet the constraint. (This need be carried out only once for each of the two bottom-edge external corner points.)

5.3 Apply width design rules:
  (a) For each point on the current bottom edge of the cell: use the Ray Tracing Routine to search backwards and forward, and:
    (i) determine the cell types backwards and forward of the current cell; and
    (ii) determine whether the distance to the point on the edge of the next cell (of a different type from the current cell) that is intersected by the ray emanating from the bottom edge of the current cell meets the minimum width constraint (determined from the design rules in Appendix A); and if not, assign an appropriate move distance to the intersected point to meet the constraint.
  (b) For each internal corner point: use the Ray Tracing Routine to search, starting at an offset point for a top edge of a neighboring cell, and assign an appropriate move distance, if necessary, to adjust the position of the intersected point to match spacing constraints.

End Bottom Edge

Top Edge: For each top edge of the current cell, DO:

5.4 Apply width design rules:
  (a) For each point on the current top edge of the cell: use the Ray Tracing Routine to search backwards and forward, and:
    (i) determine the cell types backwards and forward of the current cell; and
    (ii) determine whether the distance to the point on the edge of the next cell (of a different type from the current cell) that is intersected by the ray emanating from the top edge of the current cell meets the minimum width constraint (determined from the design rules in Appendix A); and if not, assign an appropriate move distance to the intersected point to meet the constraint.
  (b) For each internal corner point: use the Ray Tracing Routine to search, starting at an offset point for a bottom edge of a neighboring cell, and assign an appropriate move distance, if necessary, to adjust the position of the intersected point to match spacing constraints.

5.5 Apply spacing design rules:
  (a) For each point on the current top edge of the cell: use the Ray Tracing Routine to search forward to determine whether the distance to the nearest edge of a non-empty cell meets the minimum spacing constraint; and if it does not, assign an appropriate move distance to move the intersected point to meet the constraint.
  (b) For each external corner point: use the Ray Tracing Routine to search forward for any corner-to-corner spacing constraints, using a ray starting at a point offset from the current cell and intersecting the next cell, and determine whether the distance along the ray to an intersected point on an edge of the next cell meets the minimum spacing constraint; and if it does not, assign an appropriate move distance to move the intersected point to meet the constraint. (This need be carried out only once for each of the two top-edge external corner points.)

End TopEdge 5.6 Adjust points in adjacent cells having points that have previously been moved in any of steps 5.1 through 5.5, so that all bottom edges of such cells have the same move distance, and so that all top edges of such cells have the same move distance. (This adjusts the positions of all mutually adjacent edges of cells to be collinear at the position of the forwardmost such edge, i.e. the edge having the highest x- or y-value.)

5.7 If a top edge was moved by the adjacent-cell-adjustment process of 5.6, then propagate the move to all cells in the "shadow" (with larger values of the selected dimension, i.e. larger x- or y-values) of the top edge.

5.8 For all adjacent cells having points that were adjusted in step 5.6 or step 5.7, recursively do steps 5.3, 5.6 and 5.7 for all the adjacent cells of the adjacent cells.

End ALL CELLS

6. Flip the coordinate values of all points in the point table for the axis along which the circuit layout is being compressed. Rerun the ALL CELLS routine, skipping the spacing constraint Rule steps (this performs "wire length minimization").

During this second pass, the new "top" edges (which were the "bottom" edges in the prior pass) of cells are not adjusted. Only the new "bottom" edges of cells are moved, when necessary, to minimize width of the various layout regions.

7. Again flip the coordinate values (and move values) of all points in the point table for the axis along which the circuit layout is being compressed. Move the coordinates of each edge by the assigned move distance in the point table.

REPEAT FOR OTHER DIMENSION:

8. Unfracture the layout into polygons to prepare for re-fracturing in the y direction.

9. Set Compaction Dimension to y:
  Top Edges of each cell are those with largest y values.
  Bottom Edges are those with smallest y values.
  Repeat steps 1–8.

10. Generate Photolithography Masks using revised circuit layout.

Appendix D: Pseudocode for Wire Minimization Process

General Rule Regarding Offsets: For the procedure of this appendix, any $\Delta x$ or $\Delta y$ offset, in order to be assigned to a point, must result in a position for that point with a greater x- or y-value, as the case may be, than that resulting from the previously considered Δx or Δy. This applies to Δx and Δy offsets for a given direction of the coordinates, so that a Δx in the flipped direction is compared only with other Δx's in the flipped direction, and not to Δx's in the unflipped direction.

11. Prepare input layout data, including fractured cells, and create connectivity data structure with move flags reset to 0 (=not moved).
12. Create list of solid cells sorted by the lowest x coordinates.

FOR each cell in the list—first pass DO

13. Assign move distances to the bottom edges of the cell to keep it a minimum design rule spacing distance from preceding cells.
14. Assign move distances to the points on the top edges of the cell to keep the top edges a minimum design rule width distance from the bottom edges.
15. Assign move distances to the bottom edges of cells (in keeping with the General Rule above) that are in front of the current cell (i.e. have higher coordinate values) to keep these cells a minimum design rule spacing distance from the current cell.
16. Recursively adjust points of adjacent cells so that for each set of adjacent cells, i.e. cells having edges that started out with shared points, so that all the points of all mutually adjacent bottom edges have the same move distance and all points of all mutually adjacent top edges of each such set of adjacent cells have the same move distance.

END each cell in the list—first pass

17. Flip all x coordinates in the connectivity data structure. Now all former top edges are new bottom edges and former bottom edges are new top edges. Use the new top edges and new bottom edges as the top and bottom edges, respectively, in steps 18–21.
17A. Store offsets generated in the first pass operation, and assign to each point in the layout a new offset that will collapse that point to the edge of the layout having the lowest value in the selected coordinate direction (e.g. x=0 or y=0). This collapses all edges to the bottom edge of the layout.

FOR each Cell in the list—second pass DO

18. IF any point of the top edge was assigned a move distance by this second pass operation (steps 18–21), THEN:
    Use this top edge move distance to calculate the move distance for the bottom edge (heeding as always the General Rule above), to meet the meet the minimum width design rule for the current cell. This calculation will minimize the size of the current cell, and constitutes a wire length minimization step.
19. ELSE assign bottom edges of the cell the previous offset move distance as calculated in the first pass (and stored at step 17A).
20. Do steps 14–16 as described above, but carry out step 16 only for those adjacent edges that have points that have already been processed, i.e. assigned some offset, by this second pass loop of steps 18–21 (which is determined by checking the move flag).
21. Propagate the top edge move to adjacent cells (i.e. cells having edges that share points), accomplished as follows: the move distance assigned to the top edge is assigned to adjacent cells that have top edges that share at least one point with the top edge of the current cell. This process is continued for all adjacent cells. Each adjacent cell becomes the "current propagating" cell (for this subroutine) and the move distance is applied once again to top edges that share at least one point with the top edge of the current propagating cell.

END each cell in the list—second pass

21A. Reflip the x coordinates so that the bottom edges and top edges are the same bottom and top edges as originally assigned. Recombine the nonempty cells, and dispose of the connectivity data structure.
22. Rotate all layout by 90 degrees and do steps 11–21 again; this will minimize wire lengths in the y-direction.

Expansion of the procedure of Step 18: Using the top edge move distance to calculate the move distance for the bottom edge.

If a point on the top edge was previously assigned a move distance then attempt to assign a move distance to a point on the bottom edge so as to retain the top edge.pnt move distance assignment. The method for doing this is as follows:

18.1. The shared point on the top edge (boundary) must not presently be touching another part (nonempty cell) of the layout. If there is an adjacent nonempty cell, return. This is determined by the condition that:

boundary.cell.type=emptycell

This condition assures that wire length minimization is applied only to interconnects, which are generally metal contacts, and not, for instance, to gates, whose lengths are more critical and should not be minimized by this procedure.

18.2. A point on the top edge must have previously been assigned a move distance in this second pass of the procedure. The condition for this is:

topedge.fstpnt.move [2d pass]≠–infinity ("–∞"; or –X or –Y)

or topedge.nxtpnt.move [2d pass]≠–infinity ("–∞"; or –X or –Y)

("–∞" or "–infinity" indicates that it has not yet been assigned a move distance, i.e. that the offset is the default offset collapsing the point to the lowest x- or y-coordinate, as the case may be.)

18.3. A point on the top edge must have move distance (i.e. an offset assigned in the second pass) that would result in a new position that is at a lower coordinate value than the move distance assigned by the first pass. Note that this does not run contrary to the General Rule above, because for this test the offset for the second pass is being compared with the offset for the first pass. (In order to actually be assigned the new offset, the General Rule must still hold.) The condition for this is:

topedge.fstpnt.move [2d pass]<topedge.fstpnt.previousMove [1st pass]

(The point record may have a field "previousMove" that holds the move distance assigned by the first compaction step.)

18.4. Calculate the difference in move distances between the first compaction pass and the wire length minimization pass. The calculation is:

$$moveDifference = topedge.fstpnt.previousMove\ [1st\ pass] - topedge.fstpnt.move\ [2d\ pass]$$

(This difference represents the distance that the top edge will be moved in order to reduce wire length.)

18.5. Calculate the new move distance to assign to the bottom edge as follows:

$$newMove = bottomEdge.fstpnt.previousMove - movDifference$$

This newMove distance will be the amount the bottom edge must move in order to allow the top edge to move and keep the same distance between the top edge and bottom edge as determined in the first pass.

18.6. Adjust bottom edge if necessary: It may be that the bottom edge has now been assigned a move distance by a cell that was to the bottom of it ("below" it), in order to maintain a design rule minimum spacing. The "newMove" positions' coordinate value must be greater than that resulting from a previously assigned move, if any, so that the bottom edge is spaced correctly from preceding cells. If the newMove distance is greater than the current move distance for the point, then assign it the newMove distance; otherwise keep the current move distance. This is done as follows:

IF newMove>bottomEdge.fstpnt.move, THEN: bottomEdge.fstpnt.move:=newMove

What is claimed is:

1. A computer-aided design system for revising a multi-layer integrated circuit layout, comprising:
   data receiving means for receiving data representing said integrated circuit layout;
   a design rule dictionary representing a set of design rules, a first subset of said design rules involving spacing design rules and a second subset of said design rules including width design rules;
   a circuit layout database including:
     a cell table representing cells, each cell representing a region of an identified layer of said integrated circuit layout, said cell table including cells representing all empty spaces between non-empty regions of each layer of said integrated circuit layout;
     edge data representing all edges of all said cells in said cell table, said edge data including point data representing each edge's endpoints such that each point which is an edge endpoint of two or more edges is represented by a single, shared point datum; each said point datum representing a point location and a move value indicating movement of an edge's endpoint;
     adjacent cell data indicating adjacent cell data indicating, for each edge of each cell, which other cell is adjacent said cell at said edge;
   circuit layout compaction mechanism, said mechanism including:
     a circuit layout compaction procedure for adjusting, in accordance with said design rules represented by said design rule dictionary, said point data in said database so as to adjust said cells' positions and sizes; wherein each adjustment of said point data for one edge of one cell automatically adjusts a corresponding edge of said other cell adjacent to said one edge by way of their shared point data in said database;
   a wire length minimization procedure for minimizing a width of each non-empty cell whose width is not minimal and that meets a predefined criteria; wherein said wire length minimization procedure readjusts said point data for more than one edge of a selected cell and for those edges adjacent to each readjusted edge; and
   revised circuit layout generation mechanism for generating a revised circuit layout in accordance with said adjusted point data in said database.

2. The system of claim 1,
   said wire length minimization procedure including:
     a cell selection means for selecting cells from said database to process in a specified sequence, and for identifying each selected cell's top and bottom edges;
     a first bottom edge position mechanism for determining a position for each bottom edge of a selected cell;
     a top edge position mechanism for determining a position for each top edge of a selected cell, said top edge position mechanism positioning a top edge relative to said cell's bottom edge and in accordance with said width rules;
     a second bottom edge position mechanism for determining a position of a bottom edge associated with a cell that is located in front of a selected cell, said position made in accordance with said width rules; and
     an adjacent edge position mechanism for determining positions for select edges of adjacent cells to a selected cell.

3. The system of claim 2,
   said first bottom edge position mechanism including:
     a first position determination mechanism for positioning said bottom edge in a same position as determined by said circuit layout compaction procedure; and
     a second position determination mechanism for positioning said bottom edge in a different position from a position determined by said circuit layout compaction procedure if said cell's associated top edge has been positioned by said adjacent edge position mechanism, said associated top edge is adjacent only to empty cells, and application of said width design rules results in a smaller width for said selected cell.

4. A computer readable storage medium for storing data for access by programs being executed on a data processing system including at least one server computer and a plurality of client computers, said medium comprising:
   data receiving means for receiving data representing said integrated circuit layout;
   a design rule dictionary representing a set of design rules, a first subset of said design rules involving spacing design rules and a second subset of said design rules including width design rules;
   a circuit layout database including:
     a cell table representing cells, each cell representing a region of an identified layer of said integrated circuit layout, said cell table including cells representing all empty spaces between non-empty regions of each layer of said integrated circuit layout;

edge data representing all edges of all said cells in said cell table, said edge data including point data representing each edge's endpoints such that each point which is an edge endpoint of two or more edges is represented by a single, shared point datum; each said point datum representing a point location and a move value indicating movement of an edge's endpoint;

adjacent cell data indicating adjacent cell data indicating, for each edge of each cell, which other cell is adjacent said cell at said edge;

circuit layout compaction mechanism, said mechanism including:

a circuit layout compaction procedure for adjusting, in accordance with said design rules represented by said design rule dictionary, said point data in said database so as to adjust said cells' positions and sizes; wherein each adjustment of said point data for one edge of one cell automatically adjusts a corresponding edge of said other cell adjacent to said one edge by way of their shared point data in said database;

a wire length minimization procedure for minimizing a width of each non-empty cell whose width is not minimal and that meets a predefined threshold criteria; wherein said wire length minimization procedure readjusts said point data for more than one edge of a selected cell and for those edges adjacent to each readjusted edge; and revised circuit layout generation mechanism for generating a revised circuit layout in accordance with said adjusted point data in said database.

5. The medium of claim 4, said wire length minimization procedure including:

a cell selection means for selecting cells from said database to process in a specified sequence, and for identifying each selected cell's top and bottom edges;

a first bottom edge position mechanism for determining a position for each bottom edge of a selected cell;

a top edge position mechanism for determining a position for each top edge of a selected cell, said top edge position mechanism positioning a top edge relative to said cell's bottom edge and in accordance with said width rules;

a second bottom edge position mechanism for determining a position of a bottom edge associated with a cell that is located in front of a selected cell, said position made in accordance with said width rules; and an adjacent edge position mechanism for determining positions for select edges of adjacent cells to a selected cell.

6. The medium of claim 5, said first bottom edge position mechanism including:

a first position determination mechanism for positioning said bottom edge in a same position as determined by said circuit layout compaction procedure; and a second position determination mechanism for positioning said bottom edge in a different position from a position determined by said circuit layout compaction procedure if said cell's associated top edge has been positioned by said adjacent edge position mechanism, said associated top edge is adjacent to only empty cells, and application of said width design rules results in a smaller width for said selected cell.

7. A method for compacting an integrated circuit layout in accordance with a specified set of spacing design rules and width design rules, the method being executed by a processor having a memory and controlled by a program stored in the memory and including the steps of:

(1) selecting a first coordinate direction;

(2) storing in said memory a connectivity data structure representing the integrated circuit layout as a set of cells, each said cell being defined as being of a given material or as empty, the data structure including data representing points defining edges and boundaries of said cells;

(3) designating each edge of each cell in having a lower value in the selected coordinate direction as a bottom edge, and designating each edge of each cell having a higher value in the selected coordinate direction as a top edge;

(4) ordering the cells into an sorted cell list in accordance with the first coordinate direction;

(5) assigning to each point of the layout an offset reposition that point at the least-valued location of the layout in the selected coordinate direction;

(6) for each cell of the sorted cell list, selecting that cell as the current cell, and:

for each point on the top edge of the current cell, assigning each point on the top edge the maximum move distance for any points on the top edge;

for each bottom edge of the current cell, applying the spacing design rules to position edges of other cells a minimum allowable distance from an edge of the current cell, and applying the width design rules to position top and bottom edges of the current cell a minimum allowable width from one another;

for each top edge of the current cell, applying the width design rules to position top and bottom edges of the current cell a minimum allowable width from one another, and applying the spacing design rules to position edges of other cells a minimum allowable distance from an edge of the current cell;

(7) recursively adjusting edges of cells sharing points with edges having at least one point that was moved in step 6 to move edges that share points the same distance:

(8) propagating the moves of top edges that were moved in step 6 to other edges having higher-valued positions in the input layout, according to the first coordinate direction, for positioning said other edges the minimum allowable spacing distance from said top edges moved in step 6;

(9) using the move assignments of said top edges to calculate further move assignments for said bottom edges, to maximize the compaction effect on the integrated circuit layout;

(10) reversing the values of the positions of objects in the first coordinate direction such that said top edges are redefined as new bottom edges and said bottom edges are defined as new top edges; and

(11) using the move assignments of the former bottom edges (new top edges) as adjusted in step 9 to calculate further move assignments for the former top edges (new bottom edges) to maximize the compaction effect on the integrated circuit layout.

8. The method of claim 7, wherein step 9 includes the steps of:

reversing the values of the positions of objects in the first coordinate direction such that the former top edges are redefined as new bottom edges and the former bottom edges are defined as new top edges;

repeating step 6 using the reversed coordinate values to maximize the compaction effect on the integrated circuit layout.

9. The method of claim 7, further including carrying out steps 1–7 in a second coordinate direction.

10. The method of claim 7, including, after step 1 and before step 2, the step of fracturing the cells in the first coordinate direction as necessary to ensure that all stored cells are convex.

11. The method of claim 7, wherein step 9 further includes the step of using the move assignments of said bottom edges as adjusted in step 9 to calculate further move assignments for said top edges.

12. A method for revising an integrated circuit layout in accordance with a specified set of spacing design rules and width design rules, the method being executed by a processor having a memory and controlled by a program stored in the memory and including the steps of:

(1) selecting a first coordinate direction;

(2) storing in said memory a connectivity data structure representing the integrated circuit layout as a set of cells, each said cell being defined as being of a given material or as empty, the data structure including data representing points defining edges and boundaries of said cells;

(3) designating each edge of each cell having a lower value in the selected coordinate direction as a bottom edge, and designating each edge of each cell having a higher value in the selected coordinate direction as a top edge;

(4) ordering the cells into an sorted cell list in accordance with the selected coordinate direction;

(5) for each cell of the sorted cell list, selecting that cell as the current cell, and:

applying said spacing and width design rules to each top and bottom edge of said current cell, said application adjusting said edge's position and size; and recursively adjusting edges of adjacent cells affected by the application of said design rules to said current cell;

(6) designating each edge of each cell having a lower value in the selected coordinate direction as a top edge, and designating each edge of each cell having a higher value in the selected coordinate direction as a bottom edge;

(7) for each cell of the sorted cell list, selecting that cell as the current cell, and:

(i) determining a position for a bottom edge of said current cell;

(ii) applying said width design rules to a top edge of said current cell in order to position said top edge within a minimum width distance from said bottom edge;

(iii) positioning bottom edges associated with each cell located in front of said current cell in accordance with said width design rules; and (iv) adjusting select edges of adjacent cells to said current cell.

13. The method of claim 12, (8) designating each edge of each cell having a lower value in the selected coordinate direction as a bottom edge, and designating each edge of each cell having a higher value in the selected coordinate direction as a top edge;

(9) selecting a second coordinate direction; and

(10) repeating steps (2)–(7) for the second coordinate direction.

14. The method of claim 12, said step (7)(i) further comprising the steps of:

(a) determining if a top edge of said current cell was adjusted in step (7);

(b) if said top edge was adjusted in step (7), calculating a position for said bottom edge such that said bottom edge satisfies said width design rules; and (c) if said top edge was not adjusted in step (7), utilizing as a position for said bottom edge said adjusted position determined previously in step (5).

15. The method of claim 14, said 7(i)(b) further comprising the step of:

(1) performing said calculation step if said top edge is adjacent only to empty cells and application of said width design rules result in a smaller width for said cell.

* * * * *